(12) United States Patent
Treur et al.

(10) Patent No.: US 6,578,853 B1
(45) Date of Patent: Jun. 17, 2003

(54) CHUCK ASSEMBLY FOR USE IN A SPIN, RINSE, AND DRY MODULE AND METHODS FOR MAKING AND IMPLEMENTING THE SAME

(75) Inventors: Randolph E. Treur, Pleasanton, CA (US); Stephen M. Smith, Morgan Hill, CA (US)

(73) Assignee: Lam Research Corporation, Fremont, CA (US)

( * ) Notice: Subject to any disclaimer, the term of this patent is extended or adjusted under 35 U.S.C. 154(b) by 142 days.

(21) Appl. No.: 09/747,665

(22) Filed: Dec. 22, 2000

(51) Int. Cl.⁷ .............................................. H01L 21/304
(52) U.S. Cl. ......................... 279/121; 134/153; 134/902
(58) Field of Search .............................. 279/121; 34/58, 34/317; 134/149, 153, 902; 414/941; 118/503, 730

(56) References Cited

U.S. PATENT DOCUMENTS

| | | | |
|---|---|---|---|
| 4,313,266 A | | 2/1982 | Tam .................................. 34/8 |
| 4,651,440 A | | 3/1987 | Karl ................................. 34/58 |
| 5,040,484 A | * | 8/1991 | Mears et al. ................... 118/503 |
| 5,421,056 A | | 6/1995 | Tateyama et al. ............. 134/153 |
| 5,851,041 A | | 12/1998 | Anderson et al. ............. 294/106 |
| 5,974,681 A | | 11/1999 | Gonzalez-Martin et al. ... 34/58 |
| 6,167,893 B1 | * | 1/2001 | Taatjes et al. ................ 134/153 |
| RE37,347 E | * | 9/2001 | Maekawa et al. ............ 134/902 |
| 6,363,623 B1 | * | 4/2002 | Abraham ....................... 134/149 |
| 6,405,739 B1 | * | 6/2002 | Liu ............................... 134/149 |

FOREIGN PATENT DOCUMENTS

JP         2-138737         5/1990         ......... H01L/21/304

OTHER PUBLICATIONS

A. Higginson and K. Stokes, "*Disk Support for Spin Drying*", Nov. 1975, vol. 18, No. 6, IBM Technical Disclosure Bulletin.

* cited by examiner

*Primary Examiner*—Steven Wong
(74) *Attorney, Agent, or Firm*—Martine & Penilla, LLP

(57) ABSTRACT

A chuck assembly for use in a substrate spin, rinse, and dry (SRD) module is provided. The chuck assembly includes a wedge, a chuck body, and a plurality of grippers. The wedge has a sidewall and is designed to move from a lower position to an upper position and from the upper position to the lower position thus opening and closing the chuck assembly, respectively. The chuck body has a cylindrical shape and is designed to include a plurality of linkage arms. The chuck body is designed to enclose the wedge such that each linkage arm is substantially in contact with the sidewall of the wedge. The cylindrical shape of the chuck body is designed to reduce air disturbance around a surface of a substrate. The plurality of grippers are designed to be coupled to the chuck body via a plurality of rotation pins. Each of the grippers is configured to stand substantially upright so as to engage the substrate when the wedge is in a lower position, and each of the grippers is configured to lie substantially flat so as to disengage the substrate when the wedge is in the lower position.

21 Claims, 13 Drawing Sheets

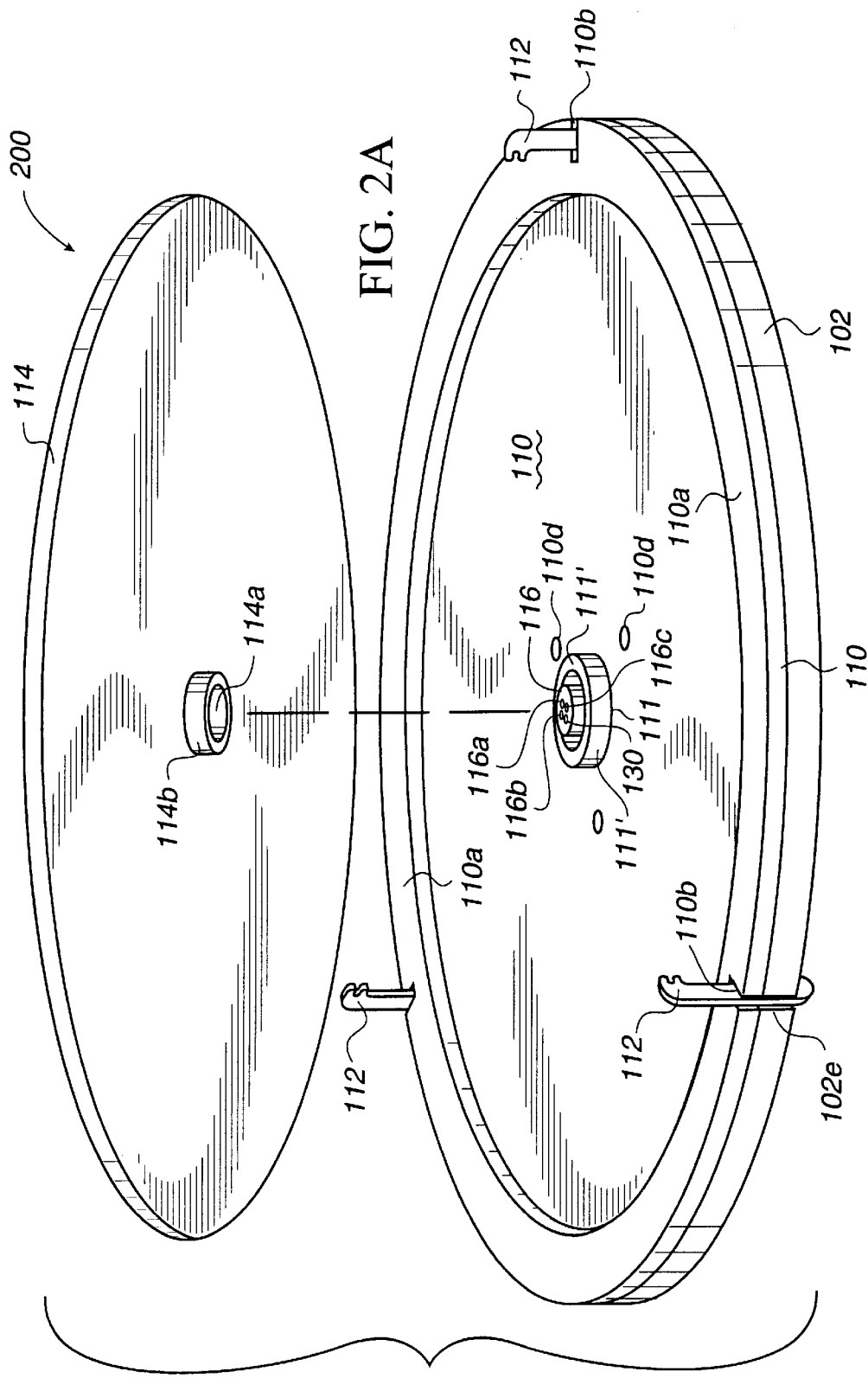

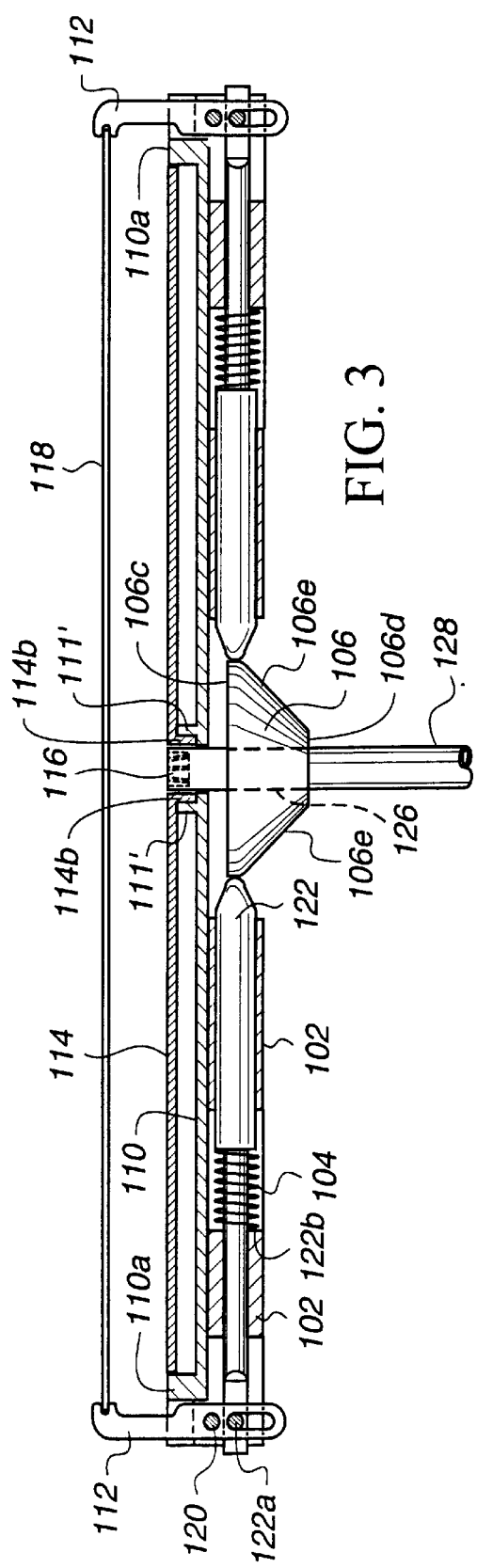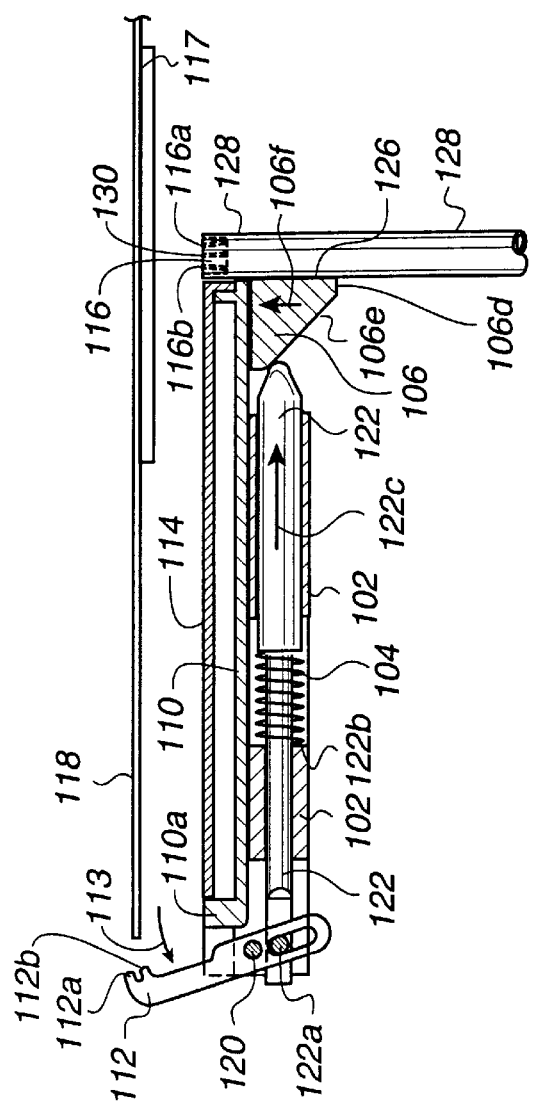

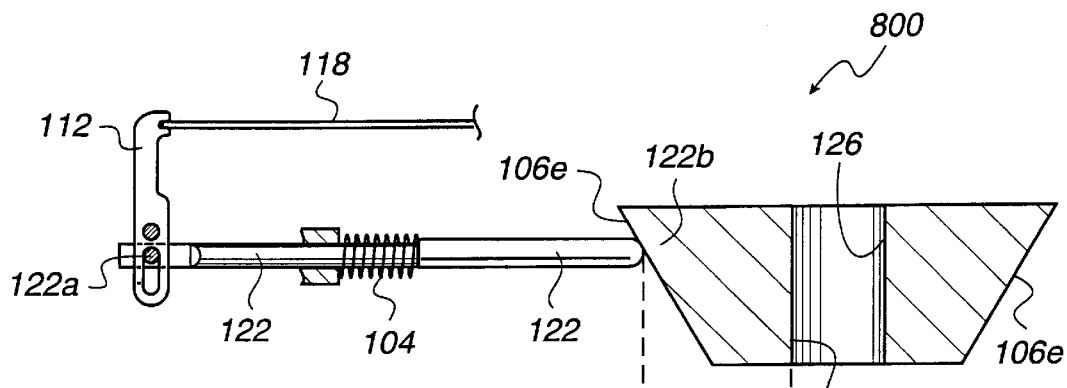
FIG. 8A
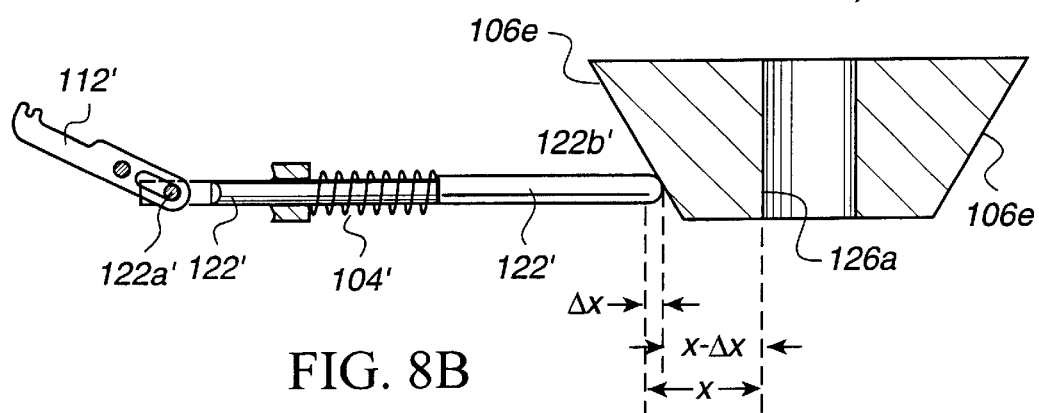
FIG. 8B
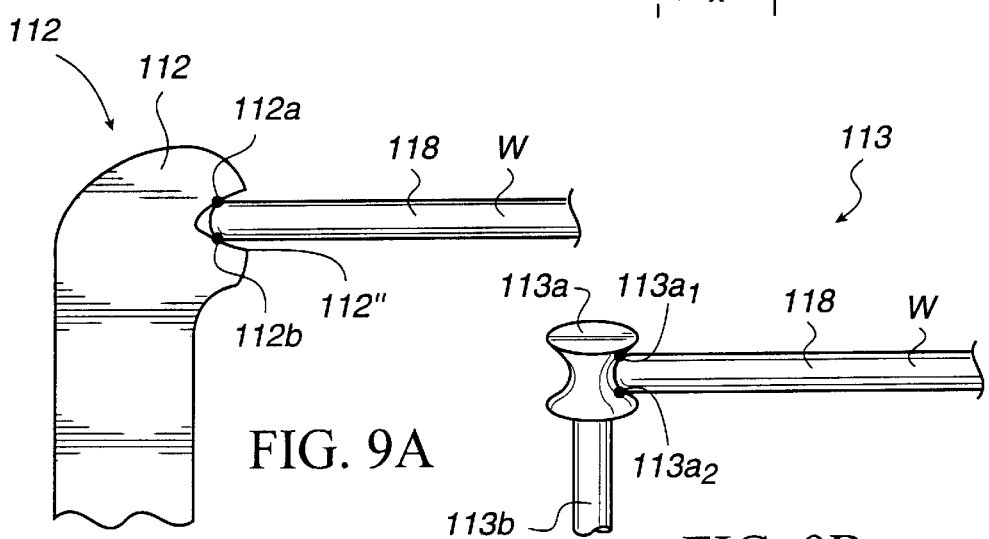
FIG. 9A
FIG. 9B

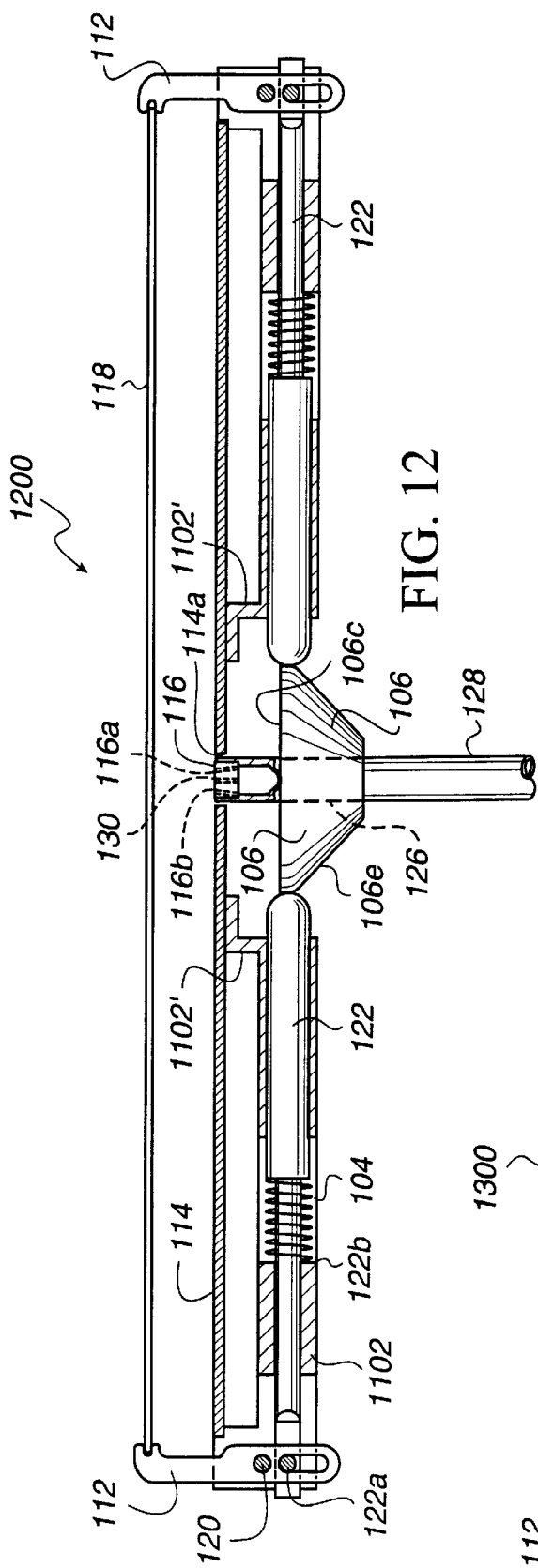
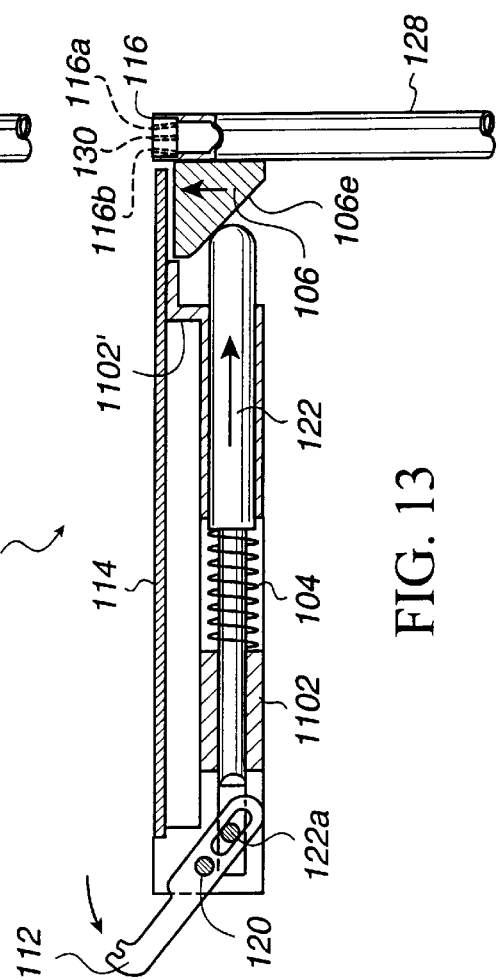
FIG. 12
FIG. 13

CHUCK ASSEMBLY FOR USE IN A SPIN, RINSE, AND DRY MODULE AND METHODS FOR MAKING AND IMPLEMENTING THE SAME

CROSS REFERENCE TO RELATED APPLICATIONS

This application is related to U.S. patent application Ser. No. 09/747,660, filed on the same day as the instant application and entitled "Wafer Backside Plate for Use in a Spin, Rinse, and Dry Module and Methods for Making and Implementing the Same."

BACKGROUND OF THE INVENTION

1. Field of the Invention

The present invention relates generally to semiconductor wafer cleaning and, more particularly, a chuck assembly to be utilized in semiconductor substrate spin, rinse, and dry (SRD) modules.

2. Description of the Related Art

Wafer preparation and cleaning operations are performed in the fabrication of semiconductor devices. One commonly used wafer preparation operation used at various stages of substrate preparation is a spin, rinse, and dry (SRD) module. Conventionally, the wafer is spin rinsed by spraying deionized water onto the top and backside of the wafer, as the wafer is spun around at high speed. The spin rinse operations are typically performed in a bowl rigidly mounted on an SRD housing designed to receive a spindle coupled to a motor. As the motor rotates, so do the spindle, a chuck mounted on the spindle, and the wafer. Customarily, the chuck supports the edges of the wafer by utilizing four spindle fingers coupled to the chuck. The spindle fingers are designed to move upwardly out of the bowl such that they extend outside the bowl housing. Thus, customarily, the wafer is delivered to the spindle fingers while they are extended out side of the bowl at a level above wafer processing plane. Once the wafer is delivered to the spindle fingers, the chuck having the spindle fingers and wafer attached thereto moves back down and into the bowl so as to place the wafer at the level of wafer processing plane.

Typically, fluid (e.g., DI water) is supplied to a spigot and thus onto the surface of the wafer, as the wafer is spun at high revolutions per minute (RPMs). When the surface of the wafer is sprayed with fluid, the supplying of fluid is stopped by turning off the spigot, and the wafer is dried as the wafer continues to spin at high RPMs. Once the wafer is dried, the processed wafer is unloaded by moving the chuck and spindle fingers holding the wafer upwardly out of the bowl until the wafer is extended above the wafer process plane for a second time. At this time, an end effector can reach in and remove the wafer from the SRD module.

Numerous shortcomings can be associated with chuck assemblies of conventional SRD modules. Primarily, the typical SRD module requires a complex chuck design. For instance, the chuck is commonly required to move up and down. The chuck moves up to receive the wafer, moves down to process the wafer and then up again to remove the wafer from the SRD bowl. In view of this continual movement activity, it is imperative that the chuck remain properly calibrated so that it comes to rest at the exact process level. In situations where the chuck is not properly aligned, failure to properly receive and deliver the wafer mandates the realignment of the chuck. The process of realigning of the chuck is very time consuming and labor intensive, and it requires that the SRD module be taken off-line for an extended period of time, thus reducing throughput.

Another shortcoming of conventional chucks is the unnecessary movements required in loading and unloading of the wafer to and from the fixed spindle fingers. Predominantly, in conventional SRD modules, the loading of the wafer onto the fixed spindle fingers involves four stages. That is, to receive a wafer, initially, the chuck is moved upwardly and out of the bowl, such that the chuck is positioned above the wafer process plane. As a result of having fixed spindle fingers to deliver the unprocessed wafer to the edges of the spindle fingers, at the outset, the end effector having the wafer is moved horizontally over the bowl at a level that is above the horizontal plane of the spindle fingers (which are already in the up position). Thereafter, the end effector must move downwardly (while over the bowl) until the wafer reaches the level of the spindle finger. At this point, the spindle fingers can engage the wafer. Once the spindle fingers have engaged the wafer, the end effector relinquishes the wafer and thus physically delivering the unprocessed wafer to the spindle fingers. Finally, to pull out, the end effector is required to move slightly down and away from the wafer under surface before moving horizontally away from over the bowl. Each of the up and down movements of the end effector are performed using the "Z" speed of the end effector, which in fact is a significantly low speed. As such, the performing of a spin, rinse and dry operation on each wafer requires a significant amount of time simply to load and unload the wafer, thus increasing the SRD cycle per wafer. As can be appreciated, this reduces the overall throughput of the SRD module.

Yet another shortcoming associated with conventional chucks of SRD modules is the creation of air turbulence above the wafer surface. That is, as the chuck and thus the wafer spin in the bowl, the spinning action of the chuck and the wafer transfer energy to air flowing over the top side of the wafer. This transferred energy causes the airflow above the topside of the wafer to become turbulent and thus creates recirculating air (i.e., eddies). The amount of energy transferred to the air flowing to the topside of the wafer depends on the diameter and the rotational speed of the wafer. In general, the greater the amount of energy transferred to the air, the higher the eddies extend above the topside and the farther the eddies extend below the backside of the wafer. The presence of eddies below the wafer is undesirable because particles or DI water droplets removed from the wafer can circulate in the eddies and can be re-deposited on the backside of the wafer, thereby causing wafer recontamination.

Further challenges faced in the use of conventional flat chucks are the limitations associated with the chuck geometry. Mainly, the relatively large size and associated weight of conventional flat chucks necessitate the use of significantly higher amounts of energy to operate the SRD module. Additionally, the large size of the chuck further requires the use of larger shafts as well as spindles. Collectively, these limitations mandate the use of a larger and more powerful motor, thus increasing the cost of the SRD modules as well as the associated operating cost.

Yet another challenge faced in the use of flat chucks in SRD modules is having chemically incompatible components present within the modules. In a typical SRD module, most components are constructed from several different materials. For instance, the chuck is usually constructed from Aluminum, while the bowl is made out of Polyurethane, and the spigot is made out of stainless steal. As a result, particles or contaminants from chemically incompatible components may enter into chemical reaction with the fluids introduced into the SRD module, thus further recontaminating the SRD module. This recontamination can further be exacerbated by the aluminum chuck having to continuously move up and down (e.g., to load and unload each new wafer) within the bowl. That is, as the chuck moves up and down within the bowl, some of its coating may flake off of the chuck, thus generating particulates and contaminants inside the bowl and the SRD module. In some cases, these contaminants may react with the residual chemicals (e.g., HF, $NH_3OH$, etc.) present in the SRD module from previous brush scrubbing operations. It is believed that these chemical reactions between the residual chemicals and the generated particulates and contaminants of the chuck may cause the recontamination of the wafer as well as the SRD module.

In view of the foregoing, a need therefore exists in the art for a chemically compatible chuck assembly that improves the spin, rinse, and dry operations performed on the surfaces of substrates while reducing the risk of wafer contamination.

SUMMARY OF THE INVENTION

Broadly speaking, the present invention fills these needs by providing an apparatus and related methods for optimizing the spin, rinse, and dry operations of a spin, rinse, and dry (SRD) module. The SRD module implements a chuck assembly constructed from chemically compatible material designed to facilitate and expedite the operations of the SRD module. Preferably, the chuck assembly is configured to operate with less mechanical movements during load and unload stages, thus accelerating the overall time of spin, rinse, and dry operations of the SRD module. In one implementation, the chuck assembly includes a plurality of grippers configured to hold the wafer to be processed. Preferably, in one embodiment, the grippers are designed to rotate about a fixed pin and are configured to assume a substantially flat position at the instances wherein a substrate is being delivered or picked up. When the substrate is to be processed, the grippers are designed to move to an upright position so as to engage the substrate.

In yet another embodiment, the geometry of the chuck assembly is configured to be cylindrical so as to reduce air turbulence above the wafer surface. In still a different implementation, the inertia of the chuck assembly is reduced, thus substantially significantly lowering the amount of energy required to operate the chuck. Preferably, in one embodiment, the inertia is reduced through decreasing the weight of the chuck assembly by hogging out portions of the inner portion of the chuck body, thus enabling the implementation of a substantially smaller motor to operate the chuck assembly.

It should be appreciated that the present invention can be implemented in numerous ways, including as a process, an apparatus, a system, a device, or a method. Several inventive embodiments of the present invention are described below.

In one embodiment, A chuck assembly for use in preparing a substrate is disclosed. The chuck assembly includes a chuck body, a chuck top plate, a plurality of grippers, and a conical-type wedge. The chuck body is designed to have a cylindrical shape configured to reduce air disturbance around a surface of the substrate. The chuck body also has an outer ring and an inner ring. The outer ring is connected to the inner ring with a plurality of spokes, each of which is configured to house a linkage arm. The chuck top plate has a ring and is configured to be attached to a top surface of the chuck body. Each gripper is coupled to the chuck body with a rotation pin and to the respective linkage arm with a linkage pin. Each gripper is configured to pivot about the respective rotation pin between a substantially upright position and a substantially flat position so as to engage or disengage the substrate. The conical-type wedge has an angled sidewall and a substantially central throughbore. A radius at a top region of the conical-type wedge is greater than a radius at a bottom region of the conical-type wedge. The conical-type wedge is configured to move between a lower position and an upper position. In the lower position, the grippers are at the substantially upright position and in the upper position, the grippers are at the substantially flat position.

In another embodiment, a chuck assembly for use in a substrate spin, rinse, and dry (SRD) module is disclosed. The chuck assembly includes a wedge, a chuck body, and a plurality of grippers. The wedge has a sidewall and is configured to move from a lower position to an upper position and from the upper position to the lower position thus opening and closing the chuck assembly, respectively. The chuck body has a cylindrical shape and is configured to include a plurality of linkage arms. The chuck body is configured to enclose the wedge such that each linkage arm is substantially in contact with the sidewall of the wedge. The cylindrical shape of the chuck body is configured to reduce air disturbance around a surface of a substrate. The plurality of grippers are configured to be coupled to the chuck body via a plurality of rotation pins. Each of the grippers is configured to stand substantially upright so as to engage the substrate when the wedge is in a lower position. Each of the grippers is configured to lie substantially flat so as to disengage the substrate when the wedge is in the lower position.

In yet another embodiment, a chuck assembly for use in preparing a substrate is disclosed. The chuck assembly includes a chuck body, a chuck top plate, a wafer backside plate, a plurality of grippers, and a wedge. The chuck body is designed to have a cylindrical shape configured to reduce air disturbance around a surface of the substrate. The chuck body has an outer ring and an inner ring. The outer ring is connected to the inner ring with a plurality of spokes, each of which is configured to house a linkage arm. The chuck top plate has a ring and is configured to be attached to a top surface of the chuck body. The wafer backside plate has a cylindrical-disk shape and is configured to be defined on a top surface of the chuck top plate. Each gripper is coupled to the chuck body with a rotation pin and to the respective linkage arm with a linkage pin. Each gripper is configured to pivot about the respective rotation pin between a substantially upright position and a substantially flat position so as to engage or disengage the substrate. The wedge has an angled sidewall and a substantially central throughbore. A radius at a top region of the wedge is greater than a radius at a bottom region of the wedge. The wedge is configured to move between a lower position and an upper position. In the lower position, the grippers are at the substantially upright position and in the upper position, the grippers are at the substantially flat position.

In still a further embodiment, an apparatus is disclosed. The apparatus includes a wedge, a chuck body, a wafer backside plate, and a plurality of grippers. The wedge has a sidewall and is configured to open and close the chuck assembly by moving from a lower position to an upper position and from the upper position to the lower position, respectively. The chuck body has a cylindrical shape and is configured to include a plurality of linkage arms. The chuck body is configured to enclose the wedge such that each linkage arm is configured to be substantially in contact with the sidewall of the wedge. The cylindrical shape of the chuck body is configured to reduce air disturbance around a surface of a substrate. The wafer backside plate is configured to include a cylindrical edge lip that defines a central aperture. The plurality of grippers are configured to be coupled to the chuck body via a plurality of rotation pins. Each of the grippers is configured to stand substantially upright so as to engage the substrate when the wedge is in the lower position. Each of the grippers is configured to lie substantially flat so as to disengage a substrate when the wedge is in the lower position.

In still a further embodiment, a method for making a chuck body for spinning a wafer is disclosed. In this method, a cylindrical disk is provided. The cylindrical disk is then machined to form an outer ring, an inner ring and a plurality of spokes. A linkage arm having an outer end and an inner end is then integrated in each of the plurality of spokes. A gripper is then attached to each outer end of each linkage arm. Each gripper is configured to rotate about a rotation pin that is connected to an edge of the outer ring. The outer end of the linkage arm is connected to the gripper by a linkage pin. Each gripper is configured to rotate between a substantially flat position when in a load or unload position and a substantially upright position when engaging the wafer.

In still another embodiment, a method for making a chuck for spinning a wafer is disclosed. In this method, a disk is machined. The machining is configured to hog-out a center portion of the disk to define an inner ring and inner ribs to define a plurality of spokes and an outer ring. Channels are then machined in each of the spokes and a linkage arm is then inserted in each channel of each spoke. Then, a gripper is attached to an outer end of each linkage arm. The grippers are defined along the outer ring and are configured to move between a substantially flat position and a substantially upright position.

In still another embodiment, a method for making a chuck for spinning a wafer is disclosed. In this method, a disk is machined. The machining is configured to hog-out a center portion of the disk to define an inner ring and inner ribs to define a plurality of spokes and an outer ring. Channels are then machined in each of the spokes and a linkage arm is then inserted in each channel of each spoke. Then, a gripper is attached to an outer end of each linkage arm. The grippers are defined along the outer ring and are configured to move between a substantially flat position and a substantially upright position. Thereafter, a plate having a shape substantially similar to the disk is attached to a top surface of the disk.

In yet another embodiment, a method for making a chuck for spinning a wafer is disclosed. In this method, a disk is machined. The machining is configured to hog-out a center portion of the disk to define an inner ring and inner ribs to define a plurality of spokes and an outer ring. Channels are then machined in each of the spokes and a linkage arm is then inserted in each channel of each spoke. Then, a gripper is attached to an outer end of each linkage arm. The grippers are defined along the outer ring and are configured to move between a substantially flat position and a substantially upright position. Thereafter, a plate having a shape substantially similar to the disk is attached to a top surface of the disk. Then, a second plate having a shape substantially similar to the disk is defined on a top surface of the first plate.

The advantages of the present invention are numerous. Most notably, unlike conventional chucks, the chuck assembly of the present invention implements less mechanical movements in loading and unloading of substrates, thus increasing the throughput of the SRD module. Particularly, instead of using fixed spindle fingers, the chuck assembly of the present invention implements a plurality of grippers capable of rotating about a rotating pin such that the grippers can assume: (a) a substantially flat position during the loading and unloading of substrates, thus eliminating the need for moving the grippers and chuck up and down; and (b) a substantially upright position so as to engage a substrate to processed. Thus, the embodiments of the present invention reduce the length of each spin, rinse, and dry cycle, thereby increasing the throughput of the SRD module. Another advantage of the chuck assembly of the present invention is that unlike conventional SRD modules in which the chuck assembly moves vertically to deliver or receive a wafer to be processed, the chuck assembly remains fixed. To move the grippers between a load/unload position and a process position, the present invention implements a wedge located at about the center of the chuck. Yet another advantage of the chuck assembly of the present invention is that the components of the chuck assembly are constructed from chemically compatible materials. Still another benefit of the chuck assembly of the present invention is that unlike conventional SRD modules which implement flat chucks, the chuck assembly of the present invention implements a cylindrical chuck including hogged out ribs, thus reducing the inertia of the chuck assembly, thereby enabling the use of a less powerful motor to operate the chuck assembly. Ultimately, the geometry of the chuck assembly of the present invention is configured to reduce air turbulence above the substrate surface, thus reducing wafer surface recontamination.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A is an isometric view of a fully put together chuck assembly in a closed position, in accordance with one embodiment of the present invention.

FIG. 3 is a schematic A—A cross-sectional view of the chuck body depicted in FIG. 2B, in accordance with yet another embodiment of the present invention.

FIG. 4 is a schematic cross-sectional view of a closed chuck assembly as it assumes an open position, in accordance with still another embodiment of the present invention.

FIG. 8A is a simplified, schematic, cross-sectional view of a closed chuck assembly having a gripper in a substantially upright position, in accordance with another embodiment of the present invention.

FIG. 8B is a simplified, schematic, cross-sectional view of an open chuck assembly having a gripper in a substantially flat position, in accordance with yet another embodiment of the present invention.

FIG. 9A is a simplified, schematic, cross-sectional view of a chuck assembly gripper, in accordance with yet another aspect of the present invention.

FIG. 9B is a simplified, schematic, cross-sectional view of a chuck assembly roller, in accordance with still another aspect of the present invention.

FIG. 12 is a cross-sectional 12—12 of the chuck body 1000 of FIG. 10, in accordance with one embodiment of the present invention.

FIG. 13 is an enlarged cross-sectional view of a chuck assembly in an open position, in accordance with yet another embodiment of the present invention.

DETAILED DESCRIPTION OF EXEMPLARY EMBODIMENTS

Figure 1:
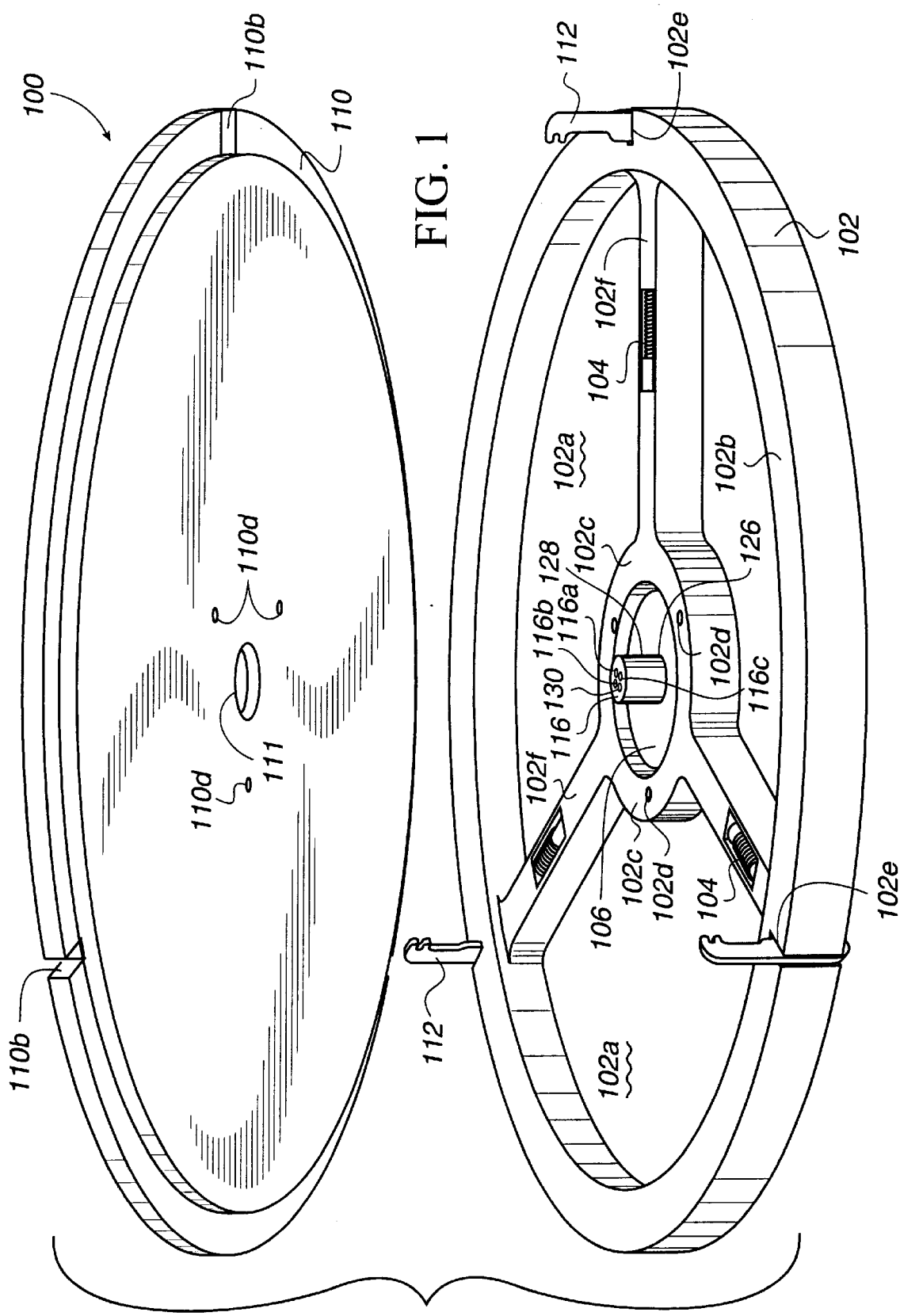
FIG. 1 is an isometric view of a chuck body and a chuck top plate of a chuck assembly, in accordance with one embodiment of the present invention.

Embodiments of a spin, rinse and dry module (SRD) and a chuck assembly for use in an SRD module for optimizing processing of substrate surfaces are described. Preferably, the SRD module implements a chuck assembly constructed from chemically compatible material designed to facilitate and expedite the operations of the SRD module. In one preferred implementation, the chuck assembly is constructed from a chemically inert material. In specific embodiments, the chuck assembly is designed to operate using fewer mechanical movements, thus accelerating the spin, rinse, and dry operations of substrates.

In one preferred embodiment, the chuck assembly includes a chuck body, chuck top plate, and a wedge configured to move vertically within the chuck body. In one preferred implementation, a wafer backside plate is defined above the chuck top plate such that the chuck body, the chuck top plate, and the wafer backside plate are positioned below a substrate process plane. The substrate process plane is herein defined as the "Z" height of the substrate at the points in time the spin, rinse, and dry operations are in progress.

In one exemplary implementation, the chuck assembly includes a plurality of grippers configured to hold the substrate to be processed. Preferably, in one aspect, the grippers are designed to rotate about a rotation pin and are configured to assume a substantially flat position at the time an unprocessed substrate is being delivered to the chuck or at the time a processed substrate is being picked up. Alternatively, the grippers are designed to stand substantially upright so as to engage the substrate to be processed. Preferably, in one implementation, the vertical movement of the wedge is designed to cause the grippers to rotate about the rotation pin. In one exemplary preferred embodiment, when the wedge is at the upper position, the grippers are designed to lay substantially open and flat against a chuck top plate (i.e., ready to load and unload a substrate for processing). However, when the wedge is moved into the lower position, the grippers are configured to stand substantially upright so as to engage and hold the substrate to be processed.

In yet another embodiment, the geometry of the chuck assembly is configured to be in the form of a cylindrical plate that lies just below the level of the substrate (which is also in the form of a disk), which thus enables a reduction in air turbulence below and above the substrate surface. In still a different implementation, the inertia of the chuck assembly is lightened, thus significantly lowering the amount of energy required to operate the chuck. Preferably, in one embodiment, the inertia is reduced through decreasing the weight of the chuck by hogging out portions of the inner region of the chuck, thus enabling the use of a substantially smaller motor to operate the chuck assembly.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

FIG. 1 is an isometric view of a chuck body 102 and a chuck top plate 110 of a chuck assembly 100, in accordance with one embodiment of the present invention. As shown, the chuck body 102 is in the shape of a cylindrical disk, as the cylindrical shape advantageously creates substantially less air disturbance in the SRD module, thus improving airflow around the substrate surface. In an exemplary embodiment, the inertia of the cylindrical chuck assembly 100 is reduced by forming hogged-out regions 102a within the chuck body 102. By way of example, the hogged-out regions 102a may be formed by machining out specific inner portions of the chuck body 102. As a result of forming the hogged-out regions 102a, the weight of the chuck body 102 is reduced, thus enabling the use of substantially less amount of energy to rotate the chuck assembly 100, thereby allowing the use of a substantially smaller motor (not shown in the Figure).

As shown, the exemplary embodiment of FIG. 1 includes 3 hogged-out regions 102a defining spokes 102f, a chuck outer ring 102b and a chuck inner ring 102c. The spokes 102f are configured to extend from the chuck outer ring 102b to the chuck inner ring 102c. Each of the spokes 102f is further configured to house a linkage arm 112 having a length substantially equivalent to the length of its respective spoke 102f. Each of the linkage arms 112 has an outer end and an inner end and is configured to cause the respective gripper 112 to move between open/close positions, as a wedge 106 moves between a lower position and an upper position. In one implementation, the wedge 116 may be a conical-type wedge. As depicted, the wedge 106 is defined within the chuck inner ring 102c of the chuck 102 and is designed to exert tension on each of the linkage arms 112 and the respective gripper 112 as the wedge 106 moves between an upper position and a lower position. In one embodiment, as shown in FIG. 1, this tension is created by spring loading each of the linkage arms 112 by nesting a segment of each of the linkage arms 112 within a spring 104. However, it must be noted that although in this embodiment a spring has been implemented to create such tension, it must be understood by one of ordinary skilled in the art that any appropriate mechanism may be used.

Further shown in FIG. 1 are chuck body gripper motion slots 120e, which are configured to allow each of the grippers to pivot about a respective rotation pin 120 (not shown in this Figure). In one embodiment, when the wedge 106 is in the upper position, each of the grippers 112 pivot about the respective rotation pin 120 and is moved backward such that the grippers lay almost parallel to the chuck top plate 110. However, when the wedge 106 moves down to the lower position, the grippers 112 are configured to rotate about the respective rotation pin 120 in the chuck body gripper motion slot 102e so as to assume an upright position. Additional details regarding the wedge 106, the grippers, the chuck assembly 100, and their mechanisms are set forth below in connection with the descriptions of FIGS. 2–9B.

Further included in FIG. 1 is the chuck top plate 110, which in this implementation, is configured to be in the shape of a cylindrical plate cover. The chuck top plate 110 will thus isolate the moving parts of the chuck body 102 from the wafer, and reduce potential contamination from particulates generated by moving parts. The chuck top plate 110 includes a plurality of chuck top plate gripper motion slots 110b, each designed to enclose a respective gripper 112. As depicted, the chuck top plate 110 is configured to be secured to the chuck body 102 by way of a plurality of fastening holes 110d designed on the chuck top plate 110 such that their positions are over a plurality of joining holes 102d which are formed around the inner ring 102c of the chuck body 102. Screws, not shown, are then attached through the fastening holes and the joining holes 102d. Further shown is a chuck top plate bore 111 that is configured to engage a manifold 116 located within a wedge 106.

As shown, the wedge 106 is to include a central throughbore 126. In one implementation, the throughbore 126 is designed to hold a sleeve 128 (not shown in this Figure) configured to contain fluid delivery tubes. The fluid delivery tubes are formed in the manifold 116. The manifold 116 has a plurality of ports 116a, 116b, and 116c designed to deliver fluids to a backside of a wafer. In one embodiment, the presence of the wafer is configured to be detected through a use of a wafer presence sensor 130 defined at about the center of the manifold 116.

Preferably, unlike the conventional chucks wherein the chuck body moves up and down within the process bowl, in the present invention, rather than the chuck body 102, the wedge 106 has been designed to vertically move within the chuck assembly 100. Thus, advantageously, the chuck assembly 100 is designed to remain at a fixed height. In this manner, unlike prior art chucks which use the vertical movement of the chuck itself to load/unload the wafer, the embodiments of the present invention utilize the vertical movement of the wedge 106 to cause the grippers to engage/disengage the wafer to be processed. Consequently, the present invention has several advantages over the prior art. First, as the chuck body 102 remains at a fixed height, unlike the prior art SRD module, the present invention eliminates the problems associated with the necessity of designing a complex chuck. Second, as the chuck body 102 remains in place horizontally, the chuck assembly 100 does not introduce further contaminants and particulates into the SRD bowl. In one embodiment, the SRD bowl 202 may be a bowl as described in U.S. patent application Ser. No. 09/470,676, filed on Dec. 23, 1999, having inventors Roy Winston Pascal and Brian M. Bliven, and entitled "Bowl, Spin, Rinse, and Dry Module, and Method for Loading a Semiconductor Wafer into a Spin, Rinse, and Dry Module." This U.S. Patent Application, which is assigned to Lam Research Corporation, the assignee of the subject application, is incorporated herein by reference.

FIG. 2A is an isometric view of a chuck assembly 200 in a closed position, in accordance with one embodiment of the present invention. As shown, a fully assembled chuck 200 includes a chuck body 102 connected to a chuck top plate 110. The chuck body 102 and the chuck top plate 110 are both configured to be in the shape of a cylindrical disk. As discussed with regards to FIG. 1, the chuck top plate 110 includes a chuck top plate bore 111 and a contiguous cylindrical ring 111' defined at about the center of the chuck top plate bore 111. As shown, when the chuck top plate 110 is placed over the chuck body 102, the chuck top plate 110 hides the wedge 106. Furthermore, when the wedge 106 is in the up position, the chuck top plate 110 is positioned such that a small gap exists between the wedge top surface 106c of the wedge 106 and the chuck top plate 110. However, when the wedge 106 is in the down position, a larger gap exists between the chuck top plate 110 and the wedge top surface 106c of the wedge 106. In one exemplary embodiment, the top surface 110a of the chuck top plate 110 is placed on top of the chuck body 102 such that the chuck top plate 110 is defined below the wafer process plane.

A plurality of grippers 112 are coupled to the chuck body 102 and are configured to pivot about the respective rotation pins 120 (not shown in this drawing). The grippers 112 are further configured to protrude above the top surface 110a of the chuck top plate 110 and chuck top plate gripper slots 110b. As shown in the embodiment of FIG. 2A, when the chuck assembly 200 is in the closed position, the grippers are configured to assume an upright position so as to engage the wafer to be processed. The chuck top plate gripper slots 110b as well as the chuck body gripper slots are configured to facilitate the pivotal movement of the grippers. The advantage of implementing grippers capable of assuming both upright and flat positions is that the grippers 112 can substantially pivot about the rotation pin (or other mechanism) so as to assume a position that is substantially parallel to the chuck top plate 110. This is beneficial as it eliminates additional mechanical movements required in loading and unloading of the chuck, as the end effector is no longer required to be raised above the gripper to load/unload the wafer. This is achievable because the grippers 112 no longer block the end effector as it loads/unloads the wafer, because in the open position, the grippers 112 lay flat.

The chuck top plate 110 is configured to be clamped to the chuck body 102, thereby sealing the linkage mechanism within the chuck assembly 200. In another example, the chuck body 102 may be fastened to a spindle. However, it must be appreciated by one of ordinary skill in the art that any appropriate fastening mechanism may be used to fasten the chuck body 102 to the chuck top plate 110.

Also shown is a wafer backside plate 114 configured to be positioned over the top surface 110a of the chuck top plate 110. As illustrated, the wafer backside plate 114 is configured to have a central hole 114a and a contiguous cylindrical edge 114b defined around the central hole 114a. The wafer backside plate 114 is configured to reduce recontamination to the backside of the wafer being processed. In one embodiment, the wafer backside plate 114 may be a wafer backside plate described in the U.S. patent application Ser. No. 09/747,660, filed on the same day as the instance application, having inventors Stephen M. Smith and Randolph E. Treur, and entitled "Wafer Backside Plate For Use In A Spin, Rinse, And Dry Module And Methods For Making And Implementing The Same." This U.S. Patent Application, which is assigned to Lam Research Corporation, the assignee of the subject application, is incorporated herein by reference.

In one implementation, the chuck body 102, the top surface 110a of the chuck top plate 110, the grippers 112, and the wafer backside plate 114 are constructed from Teflon™. However, it must be appreciated by one of ordinary skill in the art that the chuck body 102, the chuck top plate 110, the grippers 112, and the wafer backside plate 114 may be constructed from any chemically inert material (e.g., Hastalloy, High Speed Enchanted Plastic, Turchite, Polypropylene, PET, PEEK, VESPEL, DURALON, Teflon, etc.) This is beneficial because unlike conventional SRD modules which implement incompatible components thus causing module recontamination, most of the components of the chuck assembly 200 of the present invention are constructed from chemically inert materials thus preventing introduction of almost any recontaminants into the SRD module.

The contiguous cylindrical lip 114b of the wafer backside plate 114 is configured to enclose a manifold 116, as the manifold 116 protrudes above the top surface 106c of the wedge 106. Accordingly, in preferred embodiments, a radius of manifold 116 is configured to be less than a radius of the contiguous cylindrical lip 114b of the wafer backside plate 114, which in turn, is less than a radius of the contiguous cylindrical ring 111' of the chuck top plate 110. The manifold 116 includes a plurality of ports such as ports 116a, 116b, and 116c each designed to receive a fluid delivery tube. In one exemplary embodiment, different fluid may be delivered to each of the ports 116a–116c (e.g., DI water, HF, NH₃OH, nitrogen, CDA, non-residual cleaning solvents, etc.). In addition to the ports 116a–c, the manifold 116 is configured to include a wafer presence sensor 130. Additional details regarding the chuck assembly, gripper design, the manifold, and their mechanisms are set forth below in connection with the description of FIGS. 3–9B.

Figure 2B:
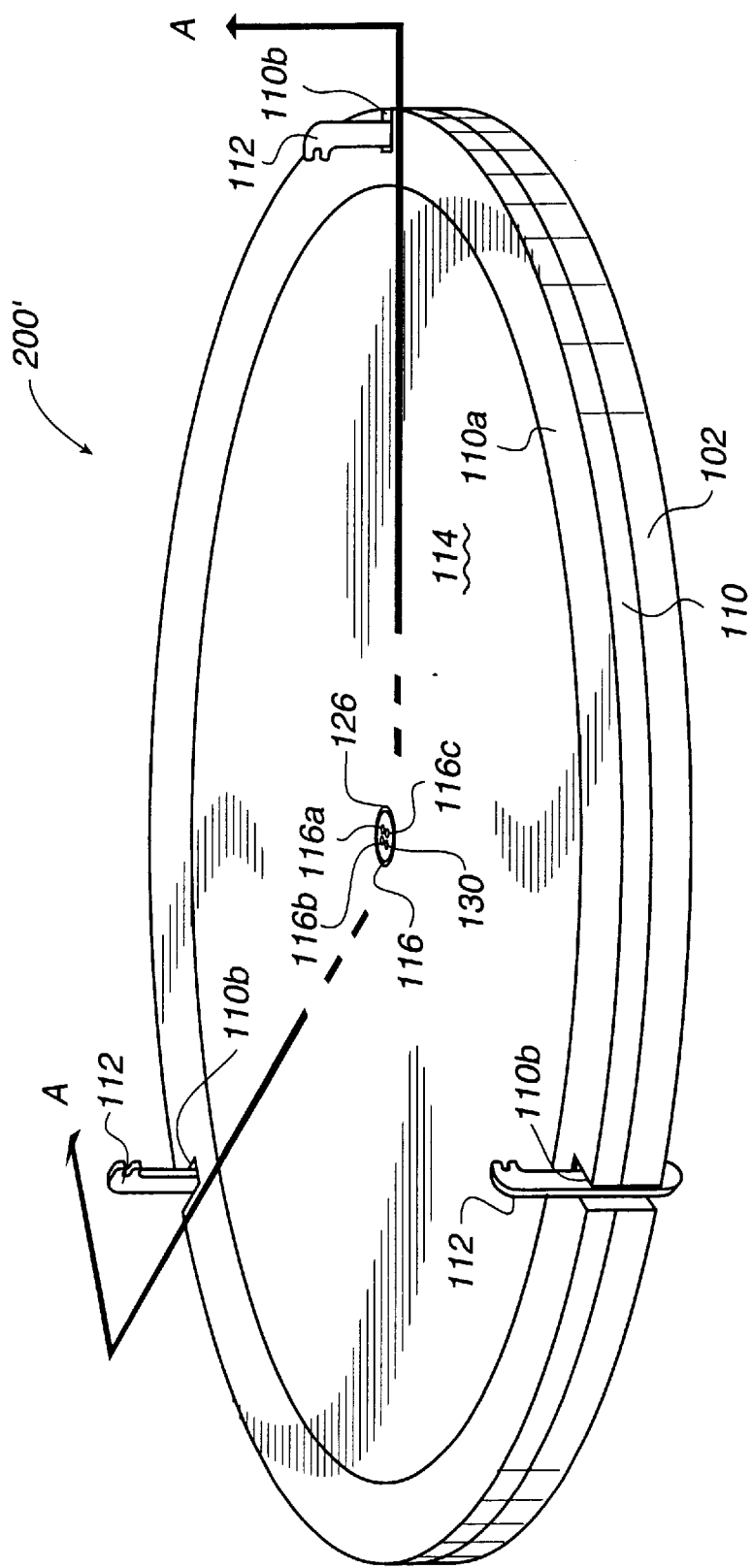
FIG. 2B is an isometric view of a fully put together chuck assembly in a closed position including a wafer backside plate, in accordance with another embodiment of the present invention.

FIG. 2B is an isometric view of a fully put together chuck assembly 200' in a closed position as it includes a wafer backside plate 114, in accordance with one embodiment of the present invention. As illustrated, the wafer backside plate 114 is placed over a chuck top plate 110 such that the wafer backside plate is substantially in the same horizontal plane as a manifold 116 and below a wafer process plane. By having the chuck top plate 110 and the wafer backside plate 114 below the wafer process plane, several mechanical movements in loading and unloading of the wafer can be eliminated, thus increasing the overall throughput of the SRD module. For instance, because the grippers 112 have the capability to pivot about the respective rotation pins 120 to load/unload a wafer, they simply assume a flat position during the loading/unloading of the wafer. That is, when the grippers 112 are substantially flat, the end effector can easily load/unload the wafer to the grippers without first having to be raised above the wafer process plane. For instance, in one embodiment, to deliver a wafer, the grippers are first placed in the open/flat position. Then, the end effector delivers the wafer substantially in the same level as the wafer process plane. Thereafter, the grippers 112 are placed in an upright/closed position, thus engaging the wafer. Although in this embodiment an end effector has been used to load/unload wafer 118, it must be appreciated by one of ordinary skill in the art that other equivalent mechanism may be utilized so long as the function of loading and unloading the wafer 118 to the grippers 112 is achieved.

A schematic A—A cross-sectional view of the chuck body 200' of FIG. 2B is depicted in FIG. 3, in accordance with another embodiment of the present invention. As shown, each of the linkage arms 122 is coupled to a respective gripper 112 with a respective linkage pin 122a, and each of the grippers 112 is coupled to a chuck body 102 using a respective rotation pin 120. Each of the grippers 112 is configured to rotate about the respective rotation pin 120 while the rotation pins 120 are configured to be substantially fixed. Although in this embodiment a rotation pin 120 is used to couple each of the grippers 112 to the chuck body 102, it must be noted that in a different embodiment, any other appropriate mechanism may be used to couple the gripper 112 to the chuck body 102.

Also shown in the embodiment of FIG. 3 is a chuck top plate 110 placed above the chuck body 102 and a wafer backside plate 114 as it is defined above the chuck top plate 110. Further depicted are the contiguous cylindrical ring 111' of the chuck top plate 110 as well as the contiguous cylindrical lip 114b of the wafer backside plate 114.

Each of the linkage arms 122 is configured to move substantially horizontally, thus exerting tension on the wedge 106 via a respective spring 104. In this embodiment, each of the springs 104 is shelved within the chuck body 102 without actually being connected to the chuck body 102 or the respective linkage arm 122. As shown, the tension steps 122b may be designed to a particular size to prevent each of the spring 104 from exerting excessive pressure onto a wedge sidewall 106e of the wedge 106. In one exemplary implementation, the tension created by each of the springs 104 is used to maintain the surface of the respective linkage arm 122 against the wedge sidewall 106e.

Further shown in the embodiment of FIG. 3 is a central throughbore 126 formed in the wedge 106. The wedge 106 is solid core and has a throughbore 126 that extends from a wedge bottom surface 106d to the wedge top surface 106c. Preferably, as the wedge 106 moves from a lower position to an upper position, the wedge 106 applies less pressure onto the linkage arms 122, which in turn, apply less pressure to the respective spring 104 and ultimately, to the respective spring step 122b. This decrease in exerted pressure on the linkage arms 122 further reduces the amount of pressure applied to the linkage pins 122a and the grippers 112, thus causing each of the grippers 112 to pivot about the respective rotation pin 120. Consequently, each of the grippers 112 pivots backward about the respective rotation pin 120 so as to assume an open/flat position, thus disengaging the wafer 118.

However, as the wedge 106 moves from the upper position to the lower position, due to the shape of the wedge 106, gradually, the radii of the point of contacts of the linkage arms 122 and the wedge sidewall 106e increases, thus increasing the amount of pressure applied to each of the linkage arms 122 and consequently, the respective spring 104 and the respective linkage pin 122a. As a result of this increase in pressure, each of the grippers 112 is pivoted forward about the respective rotation pin 120 so as to assume an upright/closed position, thus engaging the wafer 118. As shown in the embodiment of FIG. 3, a gap exists between the wedge top surface 106c and the chuck top plate 110 allowing the wedge 106 to freely move between the lower position and the upper position.

FIG. 4 is a schematic cross-sectional view of a closed chuck assembly as it transitions to an open position, in accordance with one embodiment of the present invention. As shown, a wafer backside plate 114 is positioned above a chuck top plate 110, which in turn is placed above a chuck body 102. A linkage arm 122 is coupled to a gripper 112 with a linkage pin 122a, as a spring 104 is used to create tension between the linkage arm 122 and a wedge sidewall 106e. Thus, for a gripper 112 to assume an open/flat position, the linkage arm 122 is configured to move in a movement direction 122c. In one embodiment, the movement direction 122c is configured to be a movement in the horizontal direction.

As depicted, the wedge 106 includes a throughbore 126 extending from a wedge lower surface 106d to the wedge top surface 106c. As shown, a sleeve 128 is fed through the throughbore 126 such that the sleeve 128 protrudes above the chuck top plate 110 to be flush with the level as the wafer backside plate 114. A manifold 116 is inserted into the sleeve 128 and is fitted within a sleeve outlet 128a such that the manifold 116 is also defined within the same level as the wafer backside plate 114. The manifold 116 includes a wafer sensor presence 130 used to detect the presence of the wafer 118 as well as ports 116a and 116b implemented to deliver fluid onto the backside of a wafer 118.

As shown, the gripper 112 is assuming an open/flat position as the wedge 106 is moving to an upper position. That is, as the wedge 106 is moving upwardly, the radius of the wedge 106 at the point of contact of the linkage arm 122 and the wedge sidewall 106e decreases, thus placing less pressure onto the linkage arm 122 and the spring 104. As a result, the wedge 106 pulls on the linkage arm 112, thus decreasing the pressure applied onto the linkage pin 122, thus causing the gripper 112 to pivot back so as to disengage the wafer 118. At this point, an end effector blade 117 is holding the wafer 118. Additional details with respect to the wedge 106, the wedge mechanism, the manifold 116, the grippers 112, and the chuck mechanism are set forth below in connection with FIGS. 5A–9B.

Figure 5:
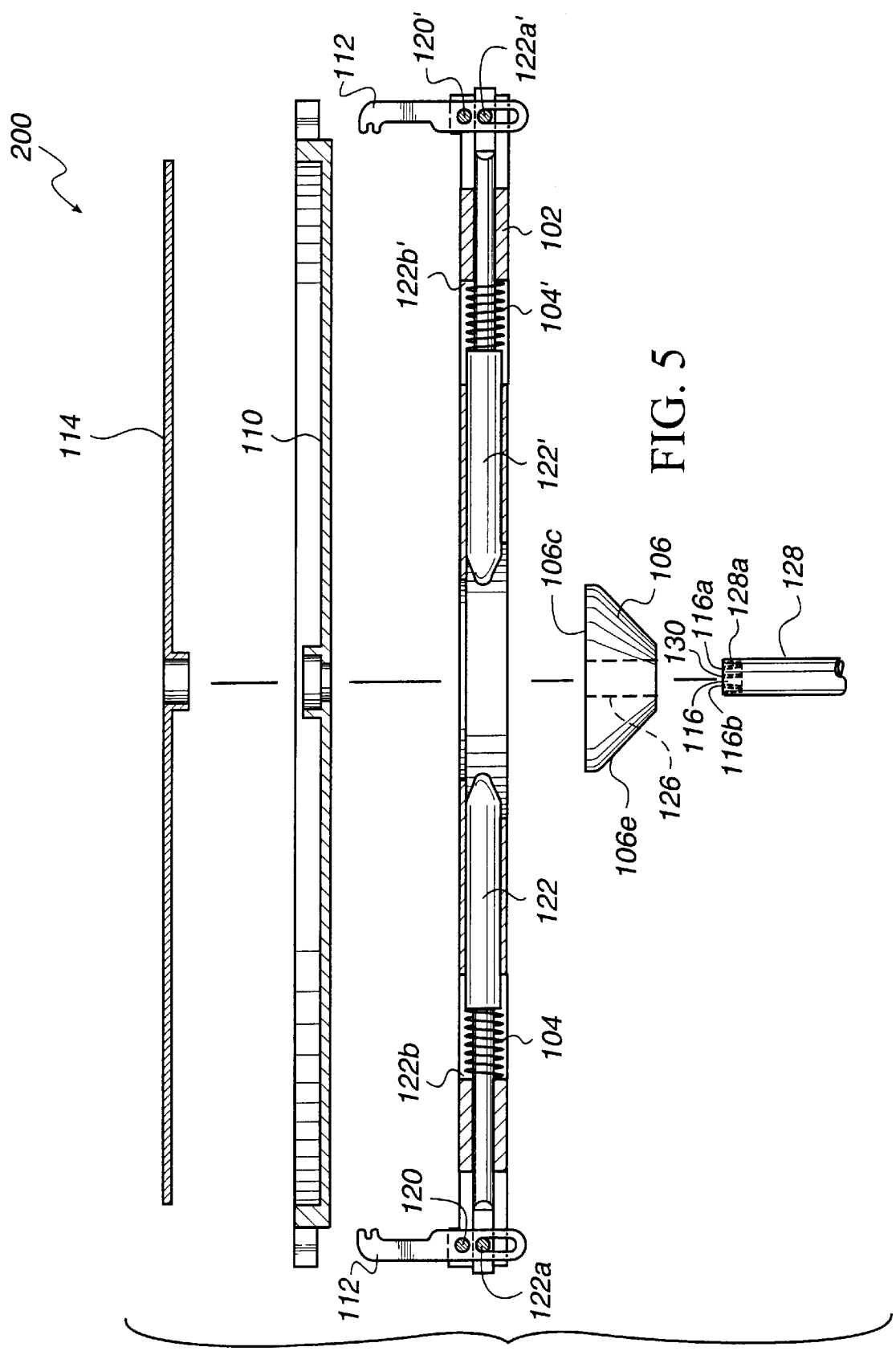
FIG. 5 is an exploded cross-sectional view of a closed chuck assembly illustrating the individual components and the manner in which the components fit together to construct the chuck assembly, in accordance with one embodiment of the present invention.

FIG. 5 is an exploded cross-sectional view of a closed chuck assembly illustrating the individual components of the chuck assembly and the manner in which the components fit together to construct the chuck assembly, in accordance with one embodiment of the present invention. As shown, the manifold 116 is inserted into the sleeve outlet 128a as a sleeve 128 is fed into the throughbore 126 of the wedge 106. The wedge 106 is in turn defined within a chuck body 102 such that linkage arms 122 and 122' come into contact with the wedge sidewall 106e, as the wedge 106 moves between an upper position and a lower position within the chuck assembly 200. A Chuck top plate 110 having a cylindrical contiguous cylindrical ring 111' is defined on top of the chuck body 102 such that a gap is defined between the chuck top plate 110 and the wedge top surface 106c. This gap exists to accommodate the vertical movements of the wedge 106 within the chuck body 102. A wafer backside plate 114 is defined on top of the chuck top plate 110. As shown, the sleeve 128 is fed through the throughbore 126, the contiguous cylindrical ring 111' of chuck top plate 110, and the contiguous cylindrical lip 114b of the wafer backside plate 114 such that the manifold 116 is defined within substantially the same horizontal plane as the wafer backside plate 114 and below the wafer process plane.

Figure 6A:
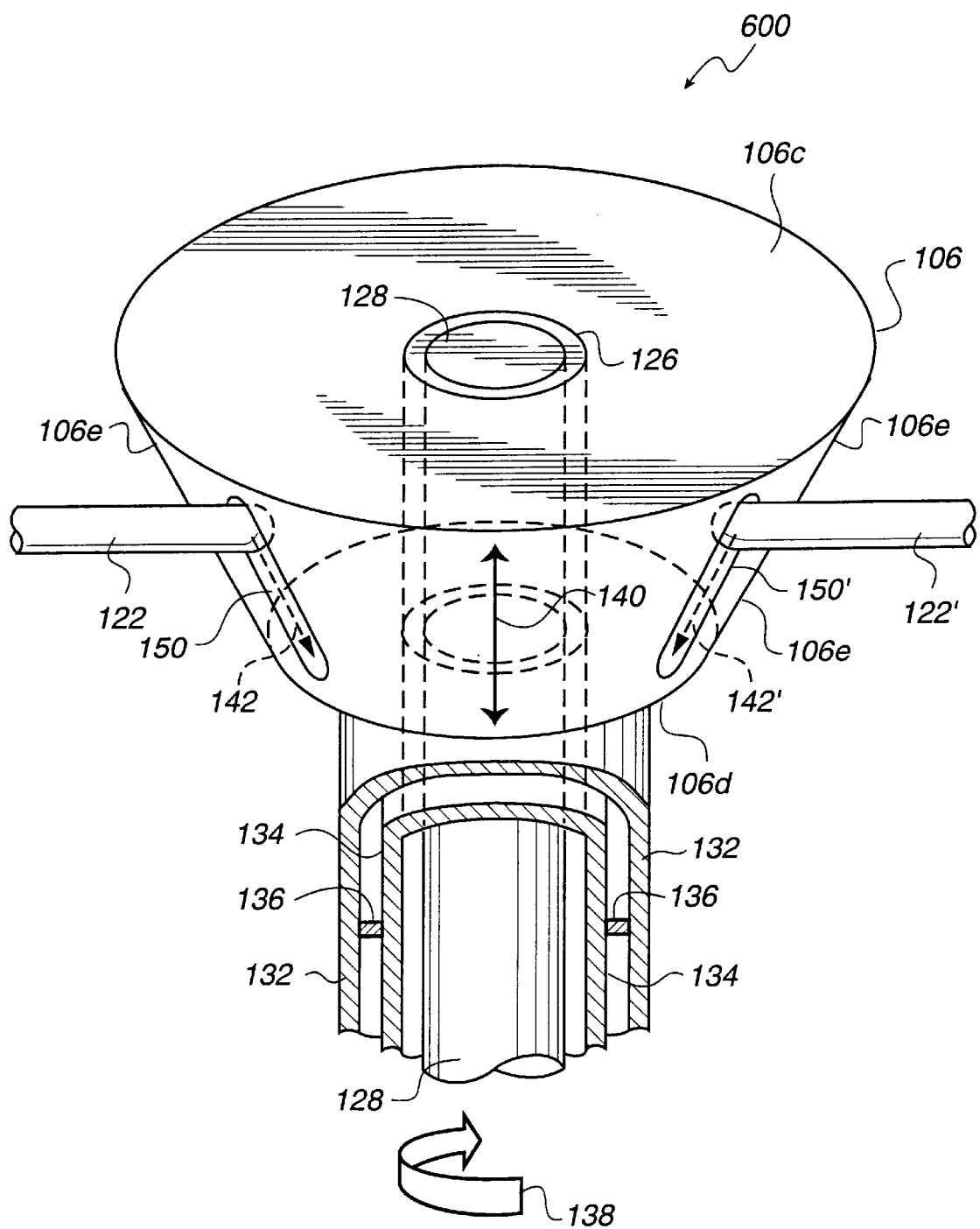
FIG. 6A is an isometric view of a wedge assembly as it assumes a lower position, in accordance with one aspect of the present invention.

FIG. 6A is an isometric view of a wedge assembly 600 as it assumes a lower position, in accordance with one embodiment of the present invention. A wedge 106 includes a wedge top surface 106c, a bottom surface 106d, and a wedge sidewall 106e. In one implementation, channels 150a and 150b may be defined substantially parallel to the wedge sidewall 106e so as to allow respective linkage arms 122 and 122' to move along the wedge sidewall 106e, from an upper position to a lower position and from a lower position to an upper position, as the wedge 106 moves upwardly and downwardly in a movement direction 140.

As shown, a linear drive shaft 134 is configured to be coupled to the wedge bottom surface 106d and is designed to define the diameter of a throughbore 126 defined within the wedge 106. The linear drive shaft 134 is configured to move the wedge 106 up and down in the movement direction 140 as the linear driver shaft 134 rotates in the rotation direction 138, thus causing the chuck assembly to assume an open or a closed position. Additionally, the linear drive shaft 134 is defined within a rotary drive shaft 132 and in one embodiment, is coupled to the rotary drive shaft 132 via pins 136. The rotary drive shaft 132 is designed to be substantially fixed in the X, Y, and Z-axes as it rotates in the rotation direction 138. Accordingly, the linear drive shaft 134 as well as the rotary drive shaft 132 are configured to rotate in the rotation direction 138. In one exemplary embodiment, the linear drive shaft 134 and rotary drive shaft 132 are configured to be constructed from substantially the same material (e.g., 300 series stainless steel, Hastalloy, Titanium, Aluminum, etc.).

As shown, a sleeve 128 is defined within the linear drive shaft 134 so as to protect the fluid delivery tubes (now shown) from the movements of the linear drive shaft 134. However, it must be understood by one of ordinary skill in the art that although in this embodiment the sleeve 128 has been implemented to protect the fluid delivery tubes from the rotational movement of the linear drive shaft 134, in a different embodiment, other isolation techniques may be used so long as the fluid delivery tubes are protected.

Figure 6B:
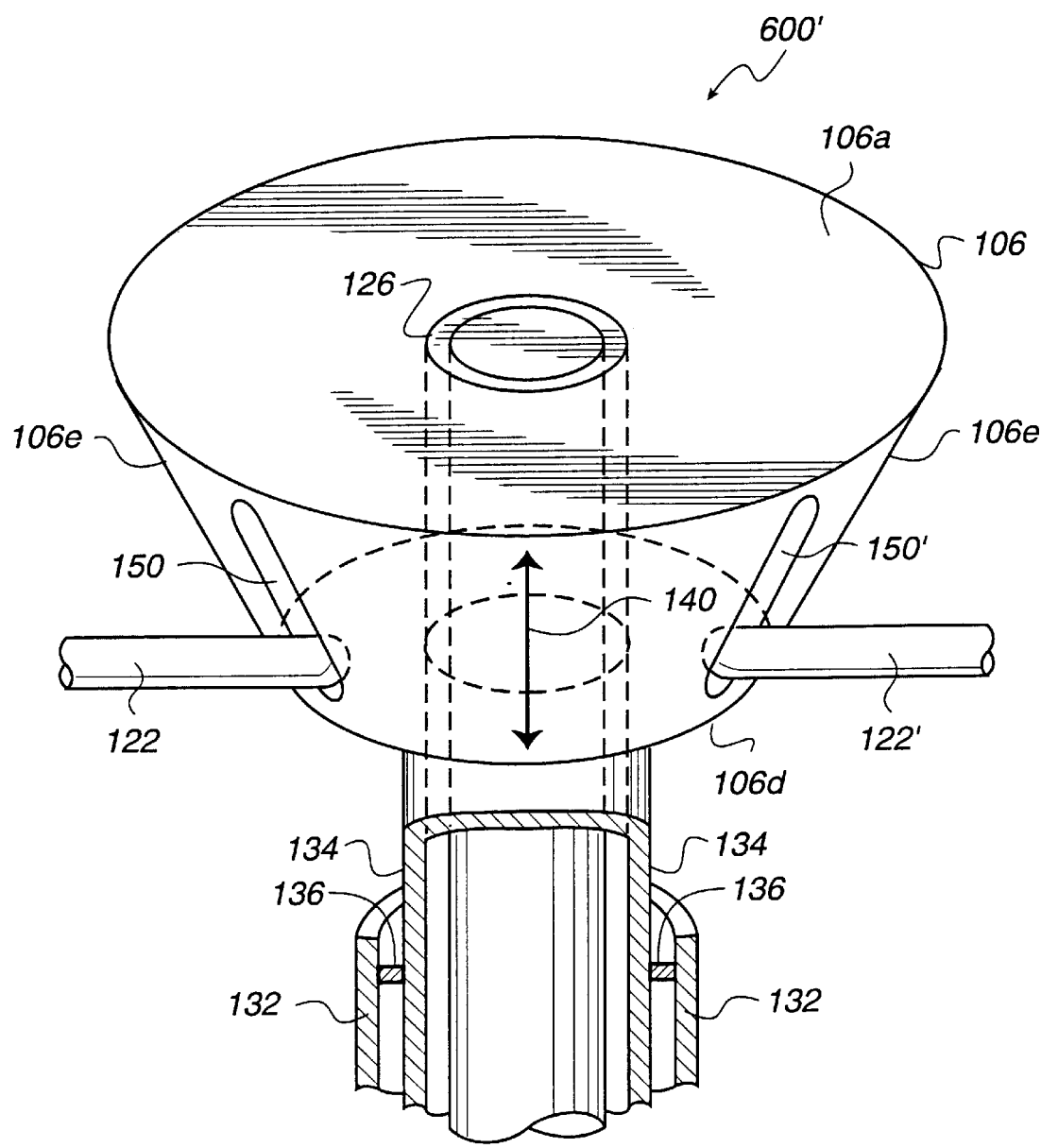
FIG. 6B is an isometric view of a wedge assembly as it assumes an upper position, in accordance with yet another aspect of the present invention.

The relationship of the linear drive shaft 134 and the rotary drive shaft 132 can further be understood with reference to FIG. 6B. As shown, while the linear drive shaft 134 is configured to be coupled to the wedge 106, the rotary drive shaft 132 is not. Accordingly, at some points in time, as the wedge 106 is moving between an upper position and a lower position in a movement direction 140, so does the linear drive shaft 134. However, as shown, in such instances, the rotary drive shaft 132 is maintained at a fixed height. This occurs because the rotary drive shaft 132 is not coupled to the wedge bottom surface 106d.

Although in the embodiments of FIGS. 6A and 6B the wedge 106 are configured to include channels 150 and 150' to facilitate the movement of the linkage arm 122 along the wedge sidewall 106e, it must be understood by one of ordinary skill in the art that any appropriate mechanism capable of facilitating the movement of the linkage arm 122 along the wedge sidewall 106e may be used instead of the channels 150 and 150' (e.g., keyways, surface to surface contact slide mechanisms, etc.) Furthermore, it must be noted that in one exemplary embodiment, one may choose not to implement any of such mechanisms on the wedge assembly 600'.

Figure 6C:
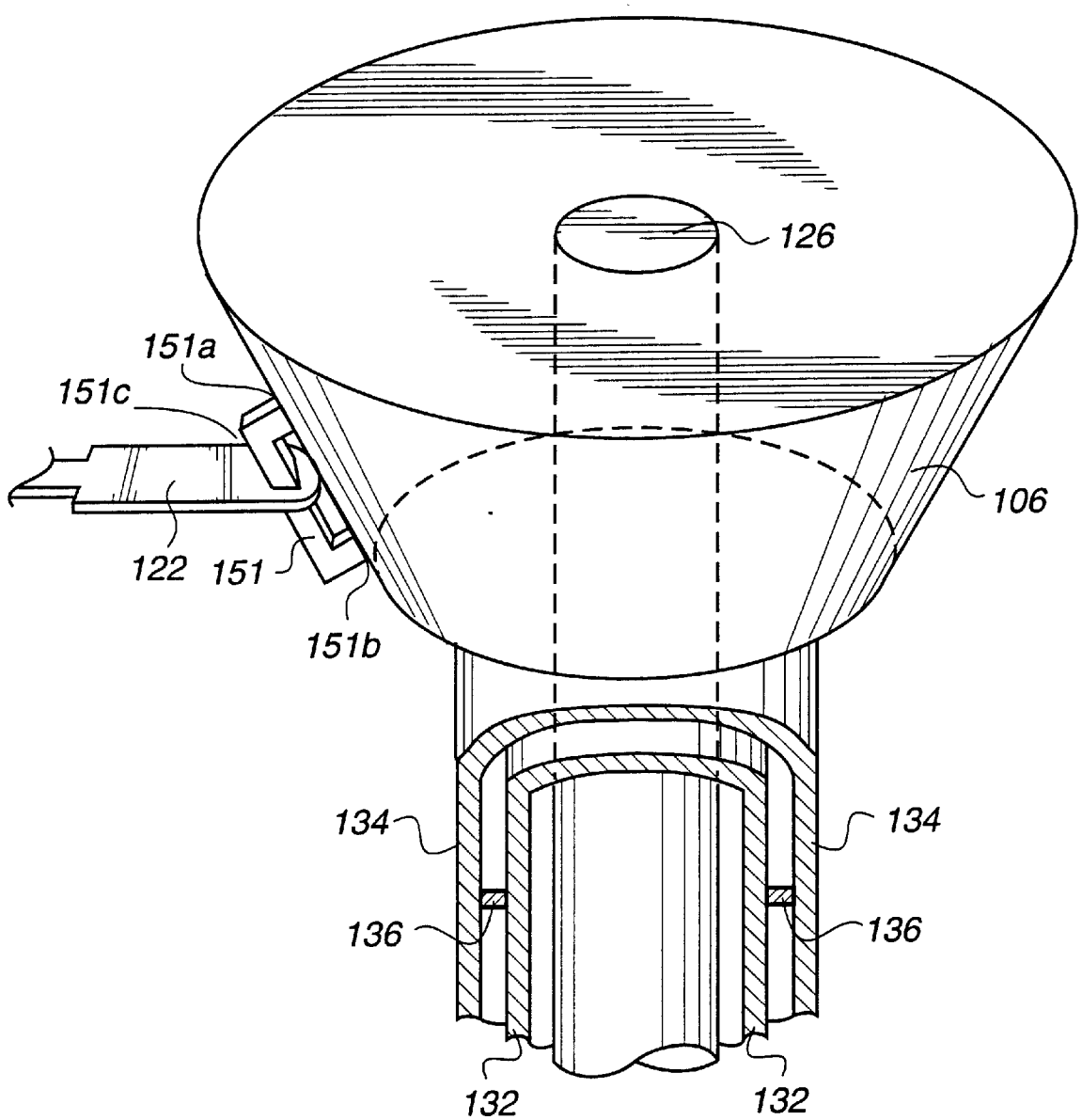
FIG. 6C is an isometric view of a wedge assembly implementing a key, in accordance with another aspect of the present invention.

For instance, as shown in the embodiment of FIG. 6C, instead of implementing a channel, a linkage arm 122 may be placed in contact with a wedge 106 via a keyway 151 coupled to a wedge 106 between points 151a and 151b. As shown, in the embodiments wherein the keyway 151 is used, there may not be a need to use a spring. Thus, in the instances wherein the wedge 106 is in the upper position, the linkage arm 122 contacts the keyway 151 at the point 151c, defined at about the upper part of the key 151. However, as the wedge 106 moves down to assume the lower position, the linkage arm 122 moves along the keyway 151 until it reaches almost the lower part of the key 151.

Figure 7A:
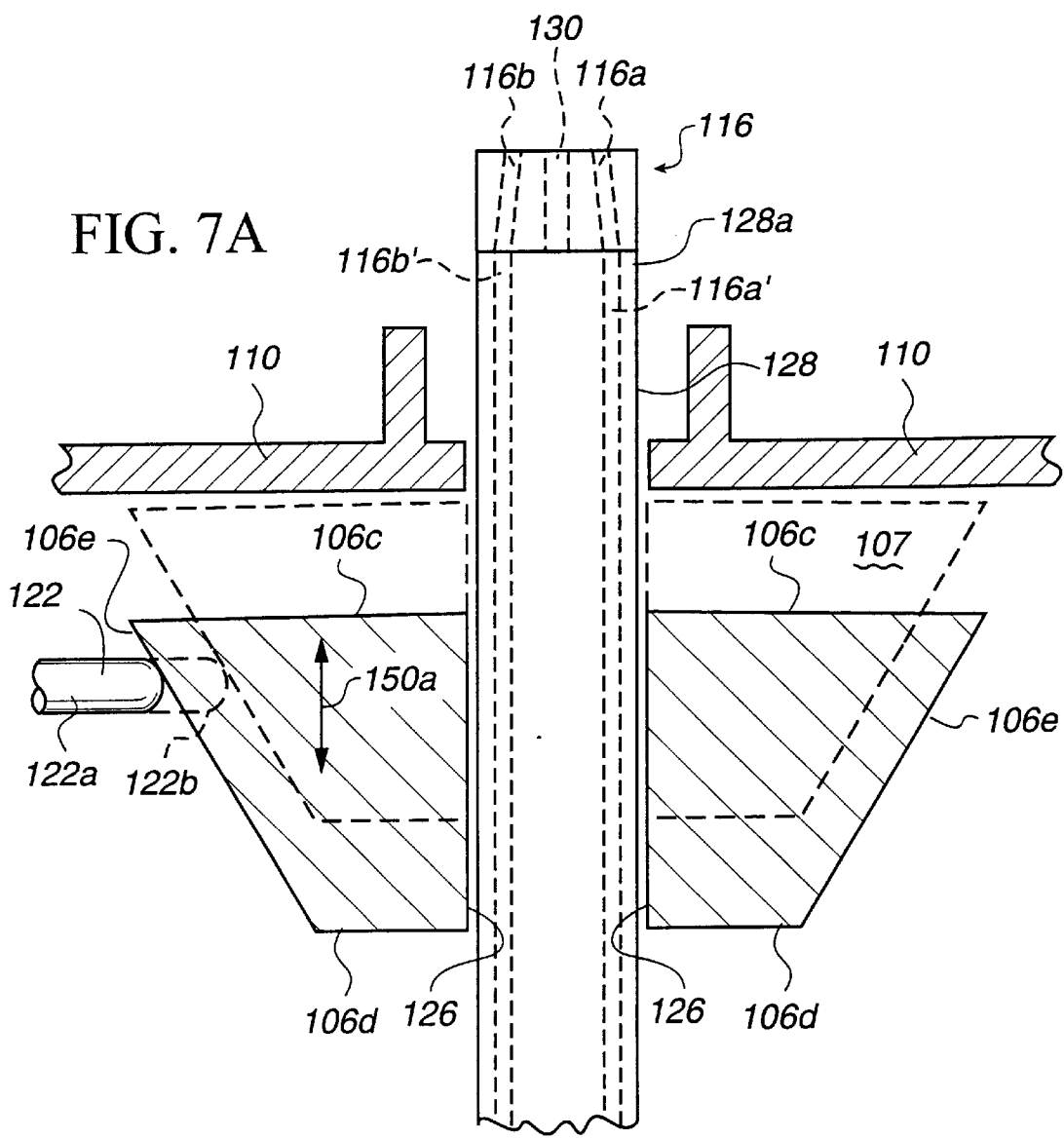
FIG. 7A is an exploded, schematic, cross-sectional view of a wedge assuming a lower position, in accordance with still another aspect of the present invention.

FIG. 7A is an exploded schematic cross-sectional view of a wedge 106 assuming an upper position, in accordance with one embodiment of the present invention. A wedge 106 includes a throughbore 126, which extends from a wedge bottom surface 106d to a wedge top surface 106c. A sleeve 128 is fed through the throughbore 126 such that the sleeve 128 protrudes above the wedge top surface 106c and above the chuck top plate 110. Preferably, the sleeve 128 is configured to be almost in the same level as the wafer backside plate 114 (not shown in this Figure), which is configured to be defined above the chuck top plate 110. A manifold 116 is inserted into the sleeve outlet 128a of the sleeve 128 and is configured to include a plurality of drilled ports 116a and 116b designed to receive fluid delivery tubes 116a' and 116b'. Also included in the manifold 116 is a wafer presence sensor 130.

As the wedge 106 moves upwardly to assume an upper position, the wedge sidewall 106e is pushed against the linkage arm 122, thus causing the linkage arm 122 to be moved along the wedge sidewall 106e in the movement direction 150a from a first position 122a to a second position 122b. As shown, a gap 107 is defined between the wedge top surface 106c and the chuck top plate 110 to prevent the wedge 106 from coming into contact with the chuck top plate 110 at the points in time the wedge 106 is in the upper position.

Figure 7B:
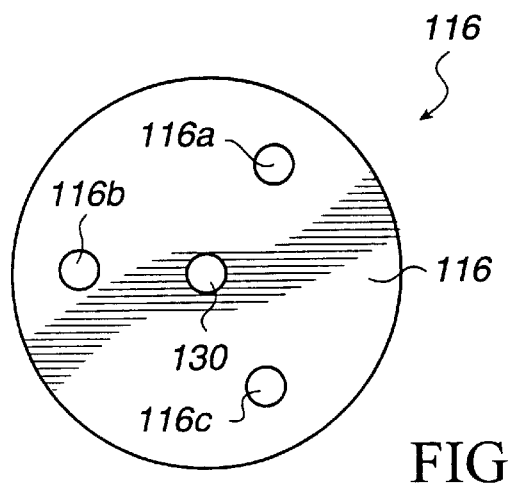
FIG. 7B is a top view of a manifold having a plurality of ports, in accordance with yet another aspect of the present invention.

FIG. 7B is a top view of a manifold 116 having a plurality of ports, in accordance with one embodiment of the present invention. Preferably, fluids are delivered through tubes that fit in the ports 116a–c so as to be implemented in the rinsing of the backside of the wafer 118. In addition to the ports 116a–c, the manifold 116 is configured to include a wafer presence sensor 130 that is used to detect the presence of a wafer.

FIGS. 8A and 8B are simplified schematic cross-sectional views of a closed chuck assembly 800 and an open chuck assembly 800', respectively, in accordance with one embodiment of the present invention. As shown in FIG. 8A, when a wedge 106 is in a lower position, a distance "d" between a point of contact 122b of a linkage arm 122 and a wedge sidewall 106e and a throughbore sidewall 126a is defined to be x. As illustrated, the distance x represents the horizontal distance between the throughbore sidewall 126a and the point of contact 122b. As shown, a gripper 112 of FIG. 7A has assumed an upright position thus engaging a wafer 118.

Comparatively, in FIG. 8B in which the wedge 106 is in an upper position, the distance "d'" between the point of contact 122b' of the linkage arm 122' and the wedge sidewall 106e is defined to be d' (i.e., x–Δx). As shown, the distance d' is the horizontal distance between the point of contact 122b' and a throughbore sidewall 126a. Accordingly, as depicted, the distance d is configured to be greater than the distance d', thus causing the pressure exerted on the wafer linkage 122 of FIG. 8A be greater than the pressure exerted on the wafer linkage 122' of FIG. 8B. As a result of this increase in exerted pressure on the linkage arm 122, a greater pressure is being applied on the linkage pin 122a, thus causing the gripper 112 to assume an upright/closed position. In contrast, as the wedge 106 moves up so as to assume an upper position, the amount of pressure exerted on the linkage 122' decreases, as the distance d' decreases, thus applying less pressure on the linkage pin 122a', causing the gripper 112' to rotate about the rotation pin 120 so as to assume a flat/open position.

FIGS. 9A and 9B are simplified schematic cross-sectional view of a chuck assembly gripper and a chuck assembly roller, in accordance with one embodiment of the present invention. In one preferred embodiment, as depicted in FIG. 9A, a gripper mouth 112" is configured to have a v-shape or an r-shape. That is, the gripper mouth 112" is configured to engage a wafer 118 in substantially two points 112a and 112b, thus increasing the tolerance of the gripper 112 as it engages/disengages the wafer 118. For instance, the wafer 118 may be configured to be wedged between the two sloped faces of the gripper mouth 112". In this manner, the gripper 112 is designed such that the gripper 112 controls the direction of force being applied on to the wafer 118.

In one exemplary implementation, the chuck assembly may implement a roller assembly 113 to engage the wafer 118 which includes a roller portion 113a and a roller base 113b. As shown in the embodiment of FIG. 9B, the roller portion 113a is configured to engage a wafer 118 in two points $113a_1$ and $113a_2$ such that the roller portion 113a controls the amount of force placed on the wafer 118 while the wafer is engaged by the roller portion 113a. In one embodiment, the roller portion 113a may be implemented such that it can rotate. Preferably, the grippers 112 and the rollers 113 are configured to be constructed from chemically inert materials (e.g., Teflon™, Hastalloy, Engineered Plastics, stainless steel, etc.)

Figure 10:
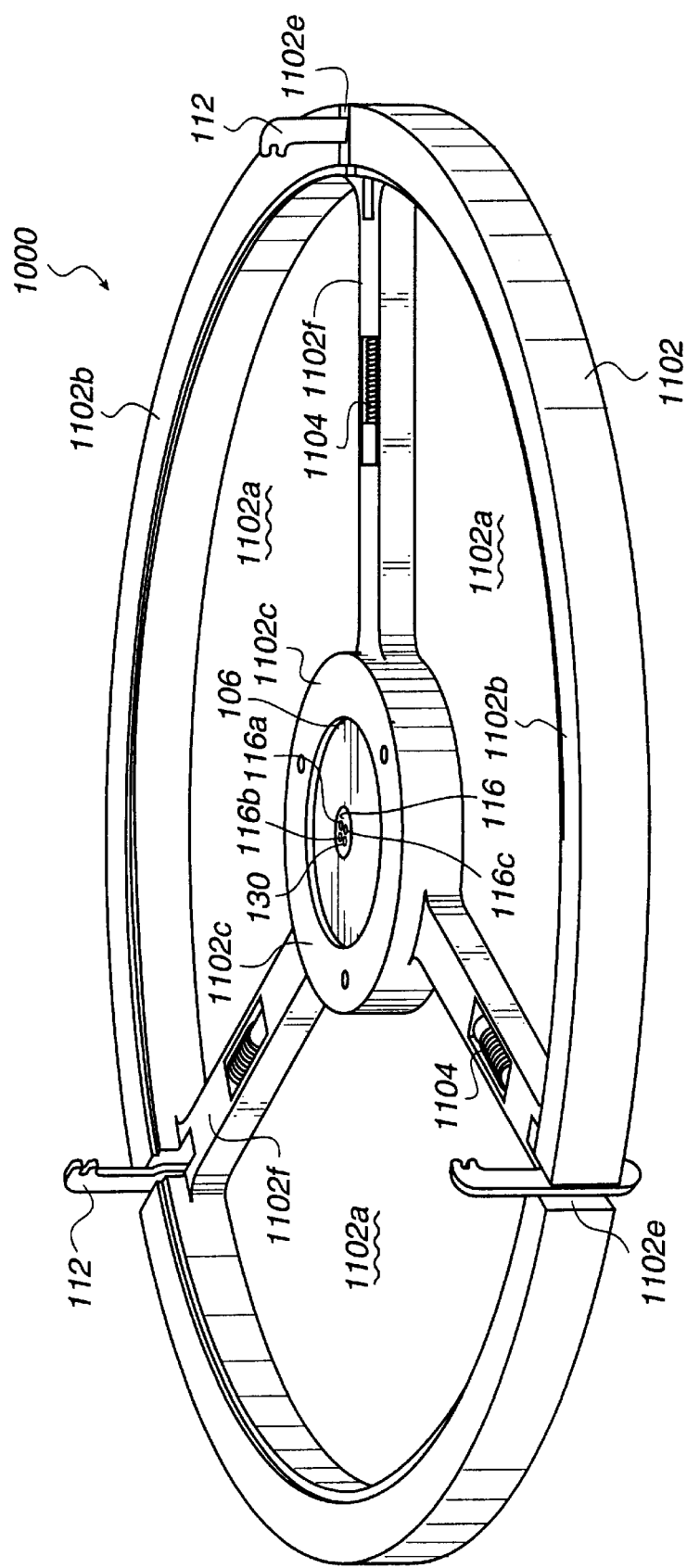
FIG. 10 is an isometric view of a chuck body of a chuck assembly in a closed position, in accordance with yet another embodiment of the present invention.

FIG. 10 is a simplified isometric view of a closed chuck assembly 1000, in accordance with another embodiment of the present invention. The chuck assembly 1000 includes a chuck body 1102, which in this embodiment is in the shape of a cylindrical disc. The chuck body includes an outer ring 1102b and an inner ring 1102c which are connected to one another via a plurality of spokes 1102f. Further shown are a plurality of hogged-out regions 1102a defined between the adjacent spokes 1102f. The hogged-out regions 1102a are defined so as to reduce the inertia of the chuck assembly 1000 thus creating a chuck assembly having a substantially less weight.

Each of the spokes 1102f is configured to house a linkage arm 112, each being substantially the same length as the respective spoke 1102f. In one exemplary embodiment, each of the linkage arms 112 uses a spring 104 to create tension between the wedge 106 and the respective gripper 112. In one embodiment, a spring 104 is configured to enclose portions of the linkage arms 112.

As illustrated, a wedge 106 is defined within the chuck inner ring 1102c and is configured to include an almost central throughbore 126. The throughbore 126 is designed to engage a sleeve which holds a manifold 116 having a plurality of ports 116a, 116b, and 116c designed to deliver fluids to a backside of a wafer.

Figure 11:
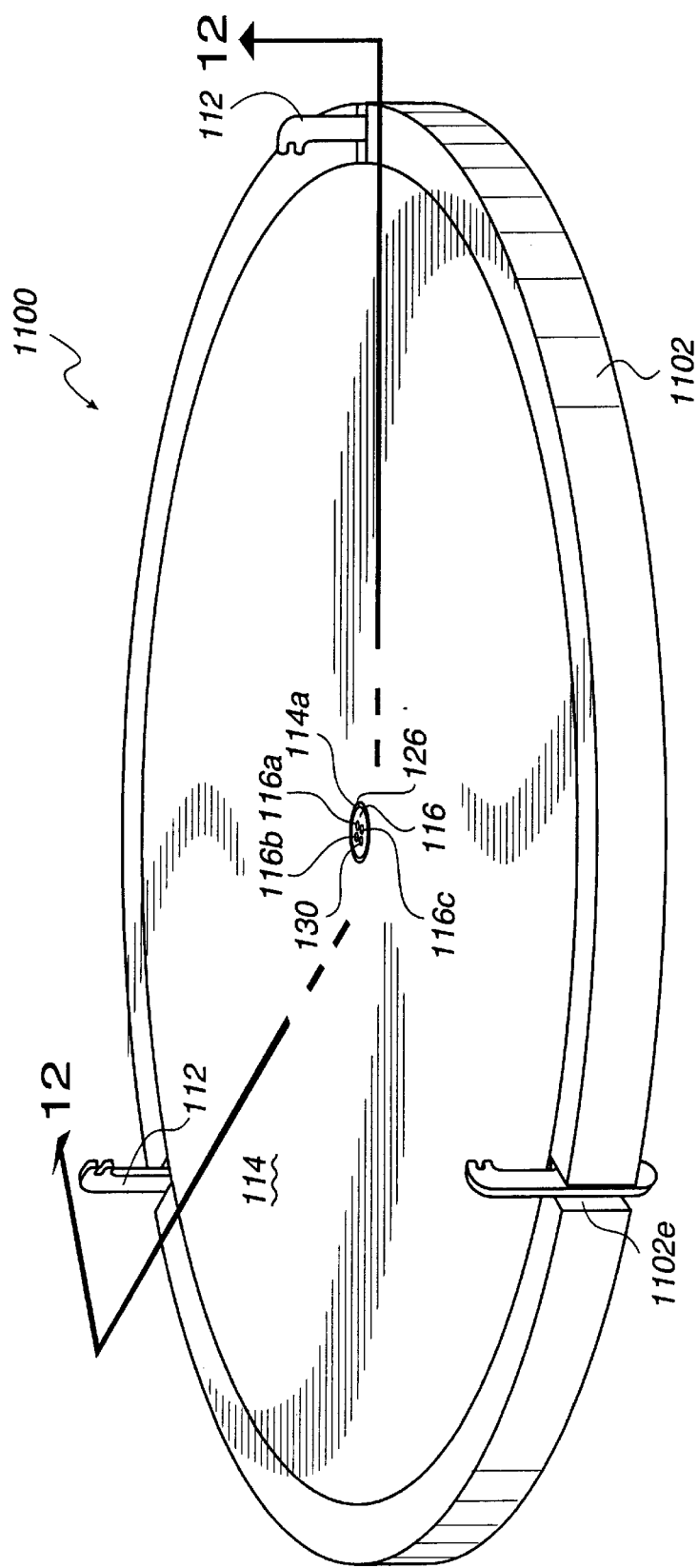
FIG. 11 is an isometric view of a fully put together chuck assembly in a closed position, in accordance with still another embodiment of the present invention.

FIG. 11 is an isometric view of a put together chuck assembly 1100 in a closed position, in accordance with one embodiment of the present invention. The assembled chuck 1100 includes the chuck body 1102 and the wafer backside plate 114 defined on top of the chuck body 1102. As shown, the wafer backside plate 114 substantially hides a wedge 106.

Preferably, when the wedge 106 is in the upper position, the wafer backside plate 114 is positioned on a rim 1102' (not shown in this Figure) of the chuck body 1102 such that a small gap exists between the top surface 1106c of the wedge 106 and the wafer backside plate 114. However, this gap is greater when the wedge 106 is in the lower position. As shown, the wafer backside plate 114 is placed over the chuck body 1102 such that the wafer backside plate 114 is defined below the wafer process plane. As defined, the wafer backside plate 114 is configured to prevent introduction of contaminants to the backside of the wafer 118. The wafer backside plate 114 is configured to be a cylindrical plate having an aperture 114a designed to enclose a manifold 116, as the manifold 116 protrudes above the wedge top surface 106c of the wedge 106. Thus, to achieve this, a radius of manifold 116 is configured to be less than the radius of the aperture 114a of the wafer backside plate 114. Further shown in FIG. 11 are a plurality of grippers 112 coupled to the chuck body 1102 as they have assumed an upright/closed position.

A cross-section 12—12 of the chuck body 1000 of FIG. 11 is depicted in FIG. 12, in accordance with another embodiment of the present invention. The gripper 112 is coupled to the linkage arm 122 with the linkage pin 122a and to the chuck body 1102 using the rotation pin 120. In one implementation, the rotation pin 120 is configured to be substantially fixed as the gripper 112 rotates about the rotation pin 120. Using a spring 104, the linkage arm 122 is designed to exert tension on a wedge sidewall 106e of a wedge 106 as the linkage arm 122 moves horizontally. A tension step 122b is used to prevent the spring 104 from exerting excessive tension onto a wedge sidewall 106e of the wedge 106. That is, in one embodiment, the tension created by the spring 104 is used to maintain the surface of the linkage arm 122 against the wedge sidewall 106e of the wedge 106.

Also shown in FIG. 12 is a wafer backside plate 114 as it is positioned above a rim 1102' of the chuck body 1102. The aperture 114a of the wafer backside plate 114 encloses the manifold 116, as the manifold 116 protrudes above the wedge top surface 106c of the wedge 106. Accordingly, in the embodiment of FIG. 12, a radius of manifold 116 is shown to be less than the radius of the aperture 114a of the wafer backside plate 114.

As illustrated, the wedge 106 is in a lower position, thus causing the grippers 112 to assume an upright/closed position. Preferably, a gap exists between the wedge top surface 106c of the wedge 106 and the rim 1102' of the chuck body 1102. As the wedge 106 moves from the upper position to the lower position, the radii of the wedge sidewall 106e at the point of contacts to the wedge sidewall 106e and the linkage arms 122 increases, thus increasing the amount of pressure applied to the linkage arms 122 and consequently, the springs 104 and the linkage pins 122a. This increase in pressure causes the grippers 112 to rotate about the respective rotation pins 120 as they are being pushed forward, thereby engaging the wafer 118 in an upright position.

FIG. 13 is a schematic cross-sectional view of a closed chuck assembly as it assumes an open position, in accordance with one embodiment of the present invention. As shown, the wedge 106 is in an upper position, as the gripper 112 is assuming a position substantially parallel to that of a wafer backside plate 114. As the wedge 106 moves upwardly, the radius of a wedge sidewall 106e at a point of contact of the linkage arm 122 and the wedge sidewall 106e decreases, thus placing less pressure on the linkage arm 122 and the spring 104. As a result of this decrease in pressure, the linkage arm 122 is pulled forward, pulling the gripper 112 back, thus causing the gripper 122 to assume a flat/open position, thereby disengaging the processed wafer.

Although the foregoing invention has been described in some detail for purposes of clarity of understanding, it will be apparent that certain changes and modifications maybe practiced within the scope of the appended claims. For example, embodiments described herein have been primarily directed toward spinning, rinsing, and drying (SRD) wafers; however, it should be understood that the SRD module of the present invention is well suited for spin rinsing of any type of substrate. Furthermore, it should be understood that the SRD module of the present invention is well suited for spin rinsing of any size wafer or substrate, such as hard disks if desired. Additionally, the embodiment of the present invention have implemented a motor to rotate the chuck assembly, it must be appreciated by one of ordinary skill in the art that any appropriate device capable of performing this function may be used. Accordingly, the present embodiments are to be considered as illustrative and not restrictive, and the invention is not to be limited to the details given herein, but may be modified within the scope and equivalents of the appended claims.

What is claimed is:

1. A chuck assembly for use in preparing a substrate, the chuck assembly comprising:

a chuck body designed to have a cylindrical shape configured to reduce air disturbance around a surface of the substrate, the chuck body having an outer ring and an inner ring, the outer ring being connected to the inner ring with a plurality of spokes, each spoke being configured to house a linkage arm;

a chuck top plate having a ring, the chuck top plate configured to be attached to a top surface of the chuck body;

a plurality of grippers, each gripper being coupled to the chuck body with a rotation pin and to the respective linkage arm with a linkage pin, each gripper being configured to pivot about the respective rotation pin between a substantially upright position and a substantially flat position so as to engage or disengage the substrate; and a conical-type wedge having an angled sidewall and a substantially central throughbore, a radius at a top region of the conical-type wedge being greater than a radius at a bottom region of the conical-type wedge, the conical-type wedge being configured to move between a lower position and an upper position, wherein in the lower position the grippers are at the substantially upright position and in the upper position the grippers are at the substantially flat position.

2. A chuck assembly for use in preparing a substrate as recited in claim 1, further comprising:

a sleeve; and a manifold being defined in the sleeve, the sleeve being positioned within the throughbore of the conical-type wedge.

3. A chuck assembly for use in preparing a substrate as recited in claim 2, wherein the manifold is configured to deliver fluid onto the under-surface of the substrate.

4. A chuck assembly for use in preparing a substrate as recited in claim 1, further comprising:

a linear drive shaft being attached to a bottom region of the conical-type wedge, the linear drive shaft being configured to move the conical-type wedge between the upper position and the lower position; and a rotary drive shaft being attached to the liner drive shaft, the rotary drive shaft being configured to rotate so as to cause the linear drive shaft and the conical-type wedge to rotate.

5. A chuck assembly for use in preparing a substrate as recited in claim 1, wherein the plurality of spokes are configured to create a plurality of ribs, the ribs being configured to reduce a weight of the chuck body.

6. A chuck assembly for use in preparing a substrate as recited in claim 1, wherein the chuck assembly is configured to be open when the conical-type wedge is in the upper position and is configured to be closed when the conical-type wedge is in the lower position.

7. A chuck assembly for use in a substrate spin, rinse, and dry (SRD) module, the chuck assembly comprising:
- a wedge having a sidewall, the wedge being configured to move from a lower position to an upper position and from the upper position to the lower position thus opening and closing the chuck assembly, respectively;
- a chuck body having a cylindrical shape, the chuck body being configured to include a plurality of linkage arms, the chuck body being configured to enclose the wedge such that each linkage arm is configured to be substantially in contact with the sidewall of the wedge, the cylindrical shape of the chuck body is configured to reduce air disturbance around a surface of a substrate; and
- a plurality of grippers configured to be coupled to the chuck body via a plurality of rotation pins, each of the grippers configured to stand substantially upright so as to engage the substrate when the wedge is in a lower position, and to lie substantially flat so as to disengage the substrate when the wedge is in the upper position.

8. A chuck assembly for use in a substrate (SRD) module as recited in claim 7, wherein the plurality of spokes are configured to outline a plurality of ribs, the ribs being configured to reduce a weight of the chuck body.

9. A chuck assembly for use in a substrate (SRD) module as recited in claim 7, further comprising:
- a wafer backside plate having a cylindrical-disk shape, the wafer backside plate configured to be connected on a top surface of the chuck top plate.

10. A chuck assembly for use in a substrate (SRD) module as recited in claim 7, further comprising:
- a wafer backside plate having a cylindrical-disk shape, the wafer backside plate configured to be defined on a top surface of the chuck body.

11. A chuck assembly for use in a substrate (SRD) module as recited in claim 7, further comprising:
- a linear drive shaft configured to be attached to a bottom region of the wedge, the linear drive shaft being configured to move the wedge between the upper position and the lower position; and
- a rotary drive shaft configured to be attached to the liner drive shaft, the rotary drive shaft being configured to rotate so as to cause the linear drive shaft and the wedge to rotate.

12. A chuck assembly for use in preparing a substrate, the chuck assembly comprising:
- a chuck body designed to have a cylindrical shape configured to reduce air disturbance around a surface of the substrate, the chuck body having an outer ring and an inner ring, the outer ring being connected to the inner ring with a plurality of spokes, each spoke being configured to house a linkage arm;
- a chuck top plate having a ring, the chuck top plate configured to be attached to a top surface of the chuck body;
- a wafer backside plate having a cylindrical-disk shape, the wafer backside plate configured to be defined on a top surface of the chuck top plate;
- a plurality of grippers, each gripper being coupled to the chuck body with a rotation pin and to the respective linkage arm with a linkage pin, each gripper being configured to pivot about the respective rotation pin between a substantially upright position and a substantially flat position so as to engage or disengage the substrate; and
- a wedge having an angled sidewall and a substantially central throughbore, a radius at a top region of the wedge being greater than a radius at a bottom region of the wedge, the wedge being configured to move between a lower position and an upper position, wherein in the lower position the grippers are at the substantially upright position and in the upper position the grippers are at the substantially flat position.

13. A chuck assembly for use in preparing a substrate as recited in claim 12, further comprising:
- a sleeve; and
- a manifold being defined in the sleeve, the sleeve being positioned within the throughbore of the wedge such that the manifold is defined on substantially the same plane as the wafer backside plate.

14. A chuck assembly for use in preparing a substrate as recited in claim 12, further comprising:
- a linear drive shaft configured to be attached to a bottom region of the wedge, the linear drive shaft being configured to move the wedge between the upper position and the lower position; and
- a rotary drive shaft configured to be attached to the liner drive shaft, the rotary drive shaft being configured to rotate so as to cause the linear drive shaft and the wedge to rotate.

15. A chuck assembly for use in preparing a substrate as recited in claim 12, wherein the plurality of spokes are configured to outline a plurality of ribs, the ribs being configured to reduce a weight of the chuck body.

16. An apparatus, comprising:
- a wedge having a sidewall, the wedge being configured to move from a lower position to an upper position and from the upper position to the lower position thus opening and closing the chuck assembly, respectively;
- a chuck body having a cylindrical shape, the chuck body being configured to include a plurality of linkage arms, the chuck body being configured to enclose the wedge such that each linkage arm is configured to be substantially in contact with the sidewall of the wedge, the cylindrical shape of the chuck body is configured to reduce air disturbance around a surface of a substrate;
- a wafer backside plate configured to include a cylindrical edge lip that defines a central aperture; and
- a plurality of grippers configured to be coupled to the chuck body via a plurality of rotation pins, each of the grippers configured to stand substantially upright so as to engage the substrate when the wedge is in the lower position, and to lie substantially flat so as to disengage a substrate when the wedge is in the upper position.

17. A apparatus as recited in claim 16, further comprising:
- a linear drive shaft configured to be attached to a bottom region of the wedge, the linear drive shaft being configured to move the wedge between the upper position and the lower position; and
- a rotary drive shaft configured to be attached to the liner drive shaft, the rotary drive shaft being configured to rotate so as to cause the linear drive shaft and the wedge to rotate.

18. A method for making a chuck body for spinning a wafer, comprising:

providing a cylindrical disk;

machining the cylindrical disk to form an outer ring, an inner ring and a plurality of spokes;

integrating a linkage arm in each of the plurality of spokes, the linkage arms having an outer end and an inner end; and attaching a gripper to each outer end of each linkage arm, each gripper configured to rotate about a rotation pin that is connected to an edge of the outer ring, and the outer end of the linkage arm being connected to the gripper by a linkage pin, whereby each gripper is configured to rotate between a substantially flat position when in a load or unload position and a substantially upright position when engaging the wafer.

19. A method for making a chuck for spinning a wafer, comprising:

machining a disk, the machining configured to hog-out a center portion to define an inner ring and inner ribs to define a plurality of spokes and an outer ring;

machining channels in each of the spokes;

inserting a linkage arm in each channel of each spoke; and attaching a gripper to an outer end of each linkage arm, the grippers being defined along the outer ring, the grippers being configured to move between a substantially flat position and a substantially upright position.

20. A method for making a chuck for spinning a wafer, comprising:

machining a disk, the machining configured to hog-out a center portion to define an inner ring and inner ribs to define a plurality of spokes and an outer ring;

machining channels in each of the spokes;

inserting a linkage arm in each channel of each spoke;

attaching a gripper to an outer end of each linkage arm, the grippers being defined along the outer ring, the grippers being configured to move between a substantially flat position and a substantially upright position; and attaching a plate having a shape substantially similar to the disk to a top surface of the disk.

21. A method for making a chuck for spinning a wafer, comprising:

machining a disk, the machining configured to hog-out a center portion to define an inner ring and inner ribs to define a plurality of spokes and an outer ring;

machining channels in each of the spokes;

inserting a linkage arm in each channel of each spoke;

attaching a gripper to an outer end of each linkage arm, the grippers being defined along the outer ring, the grippers being configured to move between a substantially flat position and a substantially upright position;

attaching a first plate having a shape substantially similar to the disk to a top surface of the disk; and defining a second plate having a shape substantially similar to the disk on a top surface of the first plate.

* * * * *